(12) United States Patent
Jung et al.

(10) Patent No.: US 12,463,136 B2
(45) Date of Patent: Nov. 4, 2025

(54) INTEGRATED CIRCUIT DEVICES INCLUDING BACKSIDE POWER RAIL AND METHODS OF FORMING THE SAME

(71) Applicant: Samsung Electronics Co., Ltd., Suwon-si (KR)

(72) Inventors: Myunghoon Jung, Clifton Park, NY (US); Wonhyuk Hong, Clifton Park, NY (US); Inchan Hwang, Schenectady, NY (US); Gunho Jo, Schenectady, NY (US); Kang-Ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 535 days.

(21) Appl. No.: 17/936,106

(22) Filed: Sep. 28, 2022

(65) Prior Publication Data

US 2023/0352408 A1    Nov. 2, 2023

Related U.S. Application Data

(60) Provisional application No. 63/336,335, filed on Apr. 29, 2022.

(51) Int. Cl.
*H01L 23/52*    (2006.01)
*H01L 23/528*    (2006.01)
(Continued)

(52) U.S. Cl.
CPC ....... *H01L 23/5286* (2013.01); *H10D 30/014* (2025.01); *H10D 30/43* (2025.01);
(Continued)

(58) Field of Classification Search
CPC ........... H01L 23/5286; H01L 21/76895; H01L 21/76898; H01L 23/485; H01L 21/76829; H10D 30/014; H10D 30/43; H10D 30/6729; H10D 30/6735; H10D 62/121; H10D 84/0167; H10D 84/017; H10D 84/0186;
(Continued)

(56) References Cited

U.S. PATENT DOCUMENTS 10,636,739 B2    4/2020   Beyne et al.
10,879,176 B2    12/2020  Lin et al.
(Continued)

OTHER PUBLICATIONS

Extended European Search Report corresponding to EP 23169854.9; dated Oct. 9, 2023 (7 pages).

*Primary Examiner* — Mohammad M Hoque
(74) *Attorney, Agent, or Firm* — Myers Bigel, P.A.

(57) ABSTRACT

Methods of forming an integrated circuit devices may include providing first and second active regions, an isolation layer, and first and second sacrificial stack structures. The first and second sacrificial stack structures may contact the first and second active regions, and the first and second sacrificial stack structures may each include a channel layer and a sacrificial layer. The methods may also include forming an etch stop layer on the isolation layer, replacing portions of the first and second sacrificial stack structures with first and second source/drain regions, forming a front contact including a front contact plug, forming a back-side insulator, and forming a back contact plug in the isolation layer and the back-side insulator. At least one of a portion of the front contact plug and a portion of the back contact plug may be in the etch stop layer.

16 Claims, 26 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ..... *H10D 30/6729* (2025.01); *H10D 30/6735* (2025.01); *H10D 62/121* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(58) Field of Classification Search
CPC .. H10D 84/0188; H10D 84/038; H10D 84/85; H10D 64/251; H10D 30/0198; H10D 30/6757; H10D 84/0149; H10D 84/83; H10D 30/024; H10D 86/01; H10D 84/834; H10D 64/254; B82Y 10/00
USPC ....................................................... 438/154
See application file for complete search history.

(56) References Cited

U.S. PATENT DOCUMENTS

| | | | |
|---|---|---|---|
| 10,985,064 B2 * | 4/2021 | Zhang | H01L 21/76816 |
| 11,121,086 B2 | 9/2021 | Hiblot et al. | |
| 11,195,930 B1 | 12/2021 | Chen et al. | |
| 11,251,308 B2 | 2/2022 | Liao et al. | |
| 11,295,985 B2 * | 4/2022 | Zhang | H10D 30/025 |
| 12,336,274 B2 * | 6/2025 | Smith | H10D 84/0186 |
| 2020/0105603 A1 | 4/2020 | Chang et al. | |
| 2020/0105671 A1 * | 4/2020 | Lai | G06F 30/394 |
| 2020/0134128 A1 * | 4/2020 | Peng | H01L 23/535 |
| 2020/0135634 A1 * | 4/2020 | Chiang | H10D 64/251 |
| 2020/0144260 A1 * | 5/2020 | Do | H10D 84/85 |
| 2021/0098294 A1 | 4/2021 | Smith | H10D 88/01 |
| 2021/0336063 A1 * | 10/2021 | Liao | H01L 23/5286 |
| 2021/0351079 A1 * | 11/2021 | Su | H10D 84/0158 |
| 2021/0375722 A1 | 12/2021 | Kim et al. | |
| 2021/0399109 A1 | 12/2021 | Su et al. | |
| 2021/0407900 A1 | 12/2021 | Yu et al. | |
| 2022/0020666 A1 | 1/2022 | Van Dal et al. | |
| 2022/0157786 A1 * | 5/2022 | Chuang | H01L 24/80 |
| 2022/0181197 A1 | 6/2022 | Tao | H01L 23/5226 |
| 2023/0073924 A1 * | 3/2023 | Xie | H10D 30/6735 |
| 2023/0132353 A1 * | 4/2023 | Xie | H01L 23/535 257/288 |
| 2023/0170395 A1 * | 6/2023 | Xie | H01L 21/76834 257/401 |
| 2023/0178433 A1 * | 6/2023 | Xie | H01L 23/535 257/621 |

* cited by examiner

INTEGRATED CIRCUIT DEVICES INCLUDING BACKSIDE POWER RAIL AND METHODS OF FORMING THE SAME

CROSS-REFERENCE TO RELATED APPLICATION

This application claims priority to U.S. Provisional Application Ser. No. 63/336,335, entitled INTEGRATED CIRCUIT DEVICES INCLUDING REVERSE VIA BACKSIDE POWER RAIL AND METHODS OF FORMING THE SAME, filed in the USPTO on Apr. 29, 2022, the disclosure of which is hereby incorporated by reference herein in its entirety.

FIELD

The present disclosure generally relates to the field of electronics and, more particularly, to integrated circuit devices including a backside power rail.

BACKGROUND

Various structures of an integrated circuit device and methods of forming the same have been proposed to simplify the middle-of-line (MOL) portion or the back-end-of-line (BEOL) portion of device fabrication so as to increase the integration density of the device. For example, a backside power rail may simplify the BEOL portion of device fabrication. An integrated circuit device, however, may include a high aspect ratio contact that electrically connects elements on a frontside and a backside of a substrate when a backside power rail is included.

SUMMARY

According to some embodiments of the present invention, methods of forming an integrated circuit devices may include providing a substrate that comprises a front surface and a back surface opposite the front surface. First and second active regions, an isolation layer, and first and second sacrificial stack structures may be provided on the front surface of the substrate, and the isolation layer may be between the first and second active regions, the first and second sacrificial stack structures may respectively contact upper surfaces of the first and second active regions, and the first and second sacrificial stack structures may each comprise a channel layer and a sacrificial layer. The methods may also include forming an etch stop layer on an upper surface of the isolation layer, replacing portions of the first and second sacrificial stack structures with first and second source/drain regions, respectively, forming a front contact that contacts the first source/drain region, wherein the front contact may comprise a front contact plug that is between the first and second source/drain regions, forming a back-side insulator on a lower surface of the isolation layer, and forming a back contact plug that is in the isolation layer and the back-side insulator and contacts a lower surface of the front contact plug. At least one of a portion of the front contact plug and a portion of the back contact plug may be in the etch stop layer.

According to some embodiments of the present invention, methods of forming an integrated circuit devices may include providing a substrate on which a front structure is provided. The substrate may comprise a front surface and a back surface opposite the front surface, and the front structure may comprise first and second active regions protruding from the front surface of the substrate, an isolation layer between the first and second active regions, an etch stop layer on the isolation layer, first and second channel layers respectively on the first and second active regions, first and second source/drain regions respectively on the first and second active regions and respectively contacting the first and second channel layers, and a gate structure crossing over the first and second channel layers and the isolation layer. The methods may also include forming a front contact that contacts the first source/drain region, forming a back-side insulator after forming the front contact, wherein the isolation layer may be between the etch stop layer and the back-side insulator, and forming a back contact plug that is in the isolation layer and the back-side insulator and contacts the front contact.

According to some embodiments of the present invention, integrated circuit devices may include first and second active regions spaced apart from each other in a first horizontal direction, first and second source/drain regions overlapping the first and second active regions, respectively, an isolation layer between the first and second active regions, a first insulator between the first and second source/drain regions on the isolation layer, an etch stop layer between the isolation layer and the first insulator, a front contact that is in the first insulator and contacts the first source/drain region, wherein the front contact may comprise a front contact plug that is between the first and second source/drain regions, a back-side insulator, wherein the isolation layer is between the etch stop layer and the back-side insulator, and a back contact plug that is in the back-side insulator and the isolation layer and contacts the front contact plug. At least one of a portion of the front contact plug and a portion of the back contact plug may be in the etch stop layer.

DETAILED DESCRIPTION

Formation of a high aspect ratio contact may involve an etch process for forming a deep and narrow opening in an insulator and a deposition process for forming a conductive layer in the deep and narrow opening. Various defects may occur during those processes. For example, a bottom portion of the opening may be undesirably narrow or may not expose an underlying conductor, thereby causing a poor electrical connection between a contact subsequently formed in the opening and the underlying conductor. Further, it may be difficult to completely fill a deep and narrow opening with a conductive layer, and a cavity may be formed in a high aspect ratio contact. That cavity may increase the resistance of the high aspect ratio contact.

According to some embodiments of the present invention, instead of a single high aspect ratio contact, two contacts, each of which has a relatively lower aspect ratio, may be formed separately and may be electrically connected to each other to serve as a single contact. Therefore, defects associated with formation of a high aspect ratio contact may be reduced.

Figure 1:
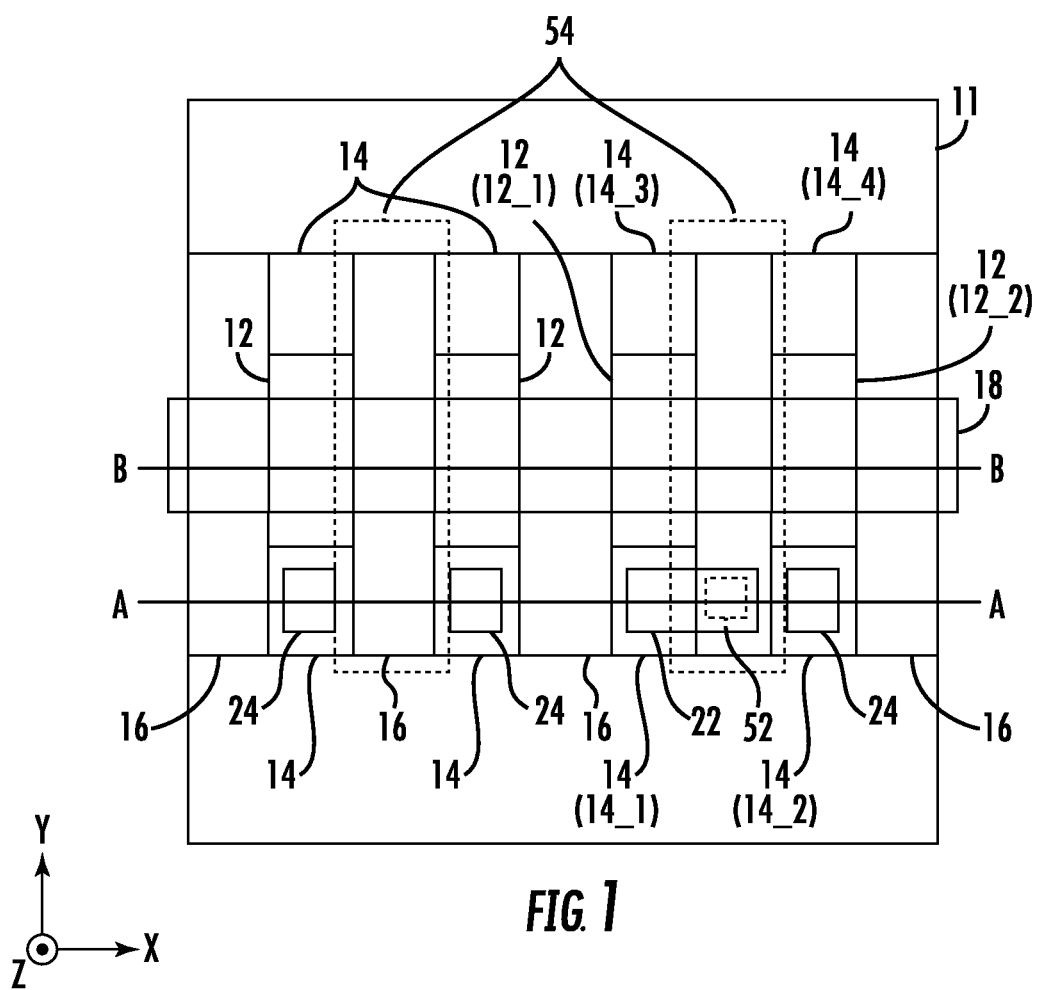
FIG. 1 is a layout of an integrated circuit device according to some embodiments.
Figure 2A:
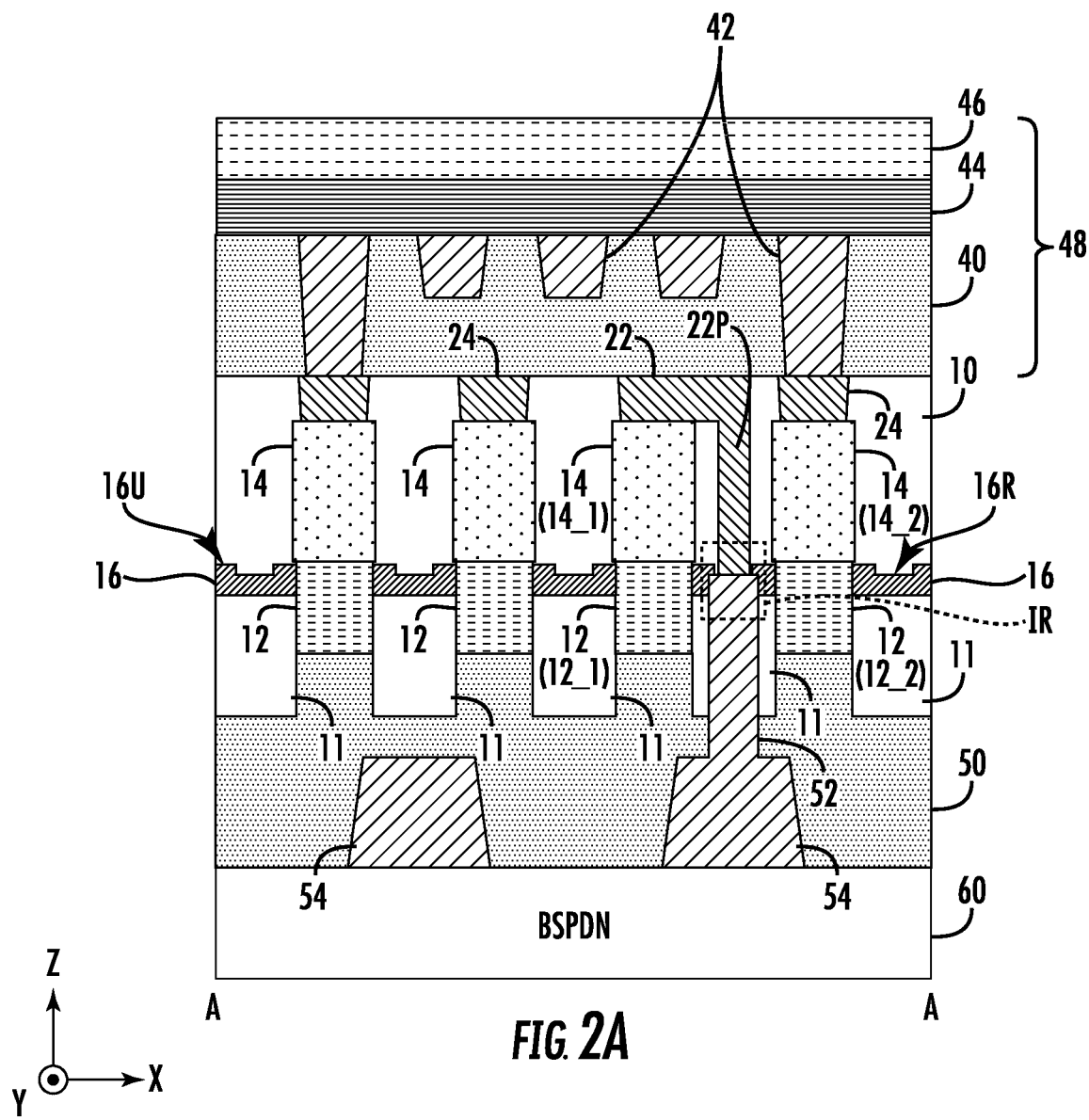
FIGS. 2A and 2B are cross-sectional views of an integrated circuit device taken along the lines A-A and B-B, respectively, in FIG. 1 according to some embodiments.
Figure 2B:
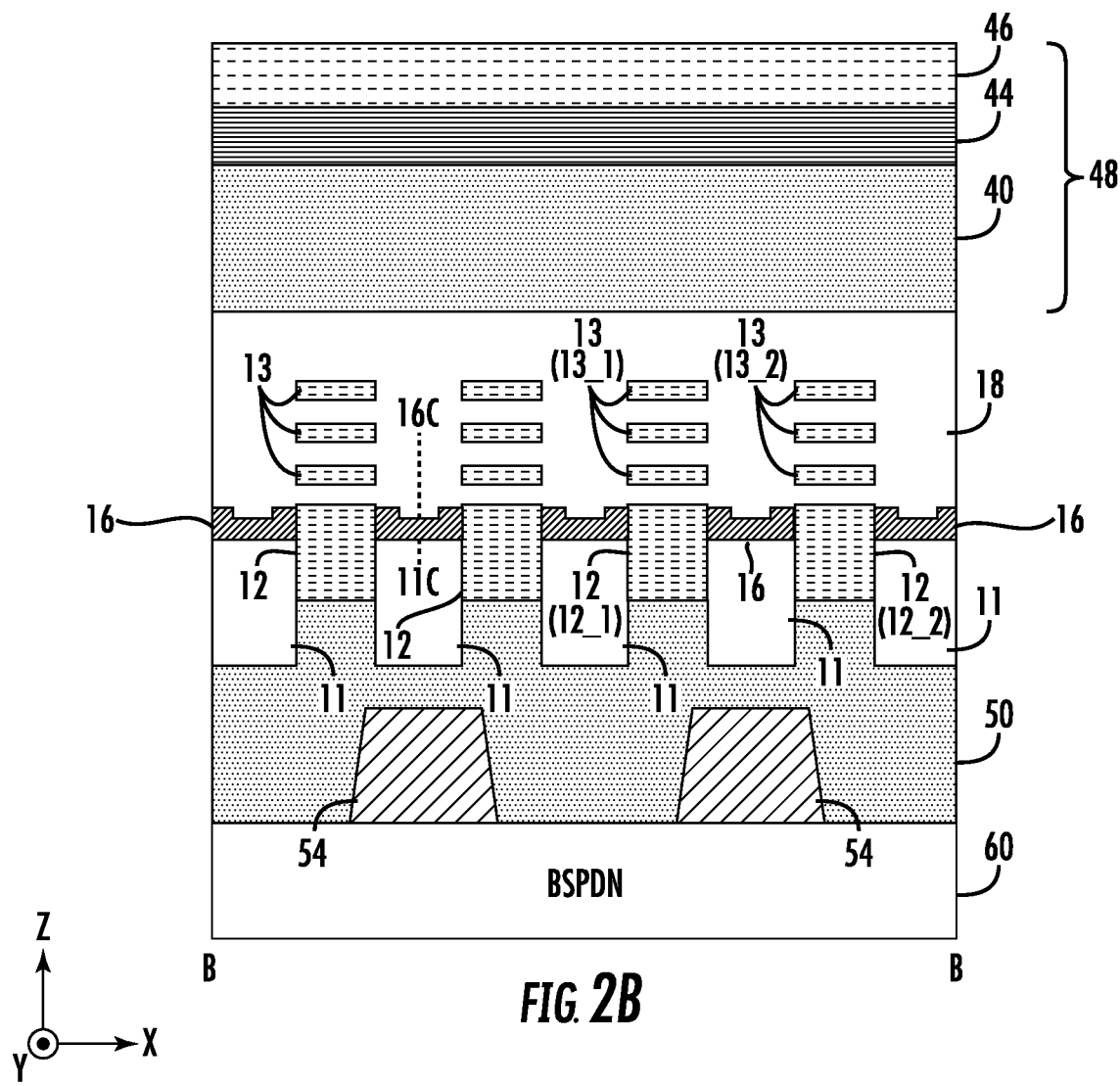

FIG. 1 is a layout of an integrated circuit device according to some embodiments, and FIGS. 2A and 2B are cross-sectional views of an integrated circuit device taken along the lines A-A and B-B, respectively, in FIG. 1 according to some embodiments. In FIG. 1, several elements (e.g., elements of a back-end structure (BES) 48) in FIGS. 2A and 2B are not shown to simplify the drawing.

Referring to FIGS. 1, 2A and 2B, the integrated circuit device may include active regions 12 (e.g., a first active region 12_1 and a second active region 12_2 directly adjacent to each other). The active regions 12 may be spaced apart from each other in a first direction X (also referred to as a first horizontal direction) and may extend longitudinally in a second direction Y (also referred to as a second horizontal direction). As used herein, "two elements A directly adjacent to each other" (or similar language) means that no other element A is located between the two elements A. The active regions 12 may include one or more semiconductor materials, for example, Si, Ge, SiGe, GaP, GaAs, SiC, SiGeC and/or InP. In some embodiments, the active regions 12 may include Si.

An isolation layer 11 may enclose the active regions 12 in a plan view, as illustrated in FIG. 1, and may include portions, each of which may be between directly adjacent active regions 12 and may separate those active regions 12 from each other. The first direction X and the second direction Y may be perpendicular to each other and may be parallel to an upper surface of the isolation layer 11. As used herein, "an upper surface of an element A" may refer to a surface of the element A facing the BES 48.

Channel layers 13 (e.g., first channel layers 13_1 and second channel layers 13_2) may be provided. In some embodiments, multiple channel layers 13 stacked in a third direction Z (also referred to as a vertical direction) may be provided on and may vertically overlap a single active region 12. For example, three first channel layers 13_1 may be provided on and may vertically overlap the first active region 12_1 as illustrated in FIG. 2B. Various numbers (e.g., one, two or more than three) of channel layers 13 may be stacked on the single active region 12. The third direction Z may be perpendicular to the first direction X and the second direction Y.

For example, each channel layer 13 may include semiconductor material(s) (e.g., Si, Ge, SiGe, GaP, GaAs, SiC, SiGeC and/or InP). In some embodiments, each channel layer 13 may be a nanosheet that may have a thickness in a range of from 1 nm to 100 nm in the third direction Z or may be a nanowire that may have a circular cross-section with a diameter in a range of from 1 nm to 100 nm.

A pair of source/drain regions 14 that are spaced apart from each other in the second direction Y may be provided on and may contact a single active region 12. First and third source/drain regions 14_1 and 14_3 may be provided on and may contact the first active region 12_1. The source/drain regions 14 may include, for example, a semiconductor material (e.g., Si, Ge, SiGe, GaP, GaAs, SiC, SiGeC and/or InP) and may optionally include impurities (e.g., B, P or As).

A gate structure 18 may be provided on the active regions 12. The gate structure 18 may cross over the active regions 12 and may be provided on the channel layers 13. The gate structure 18 may enclose the channel layers 13 as illustrated in FIG. 2B. Although the gate structure 18 is illustrated as a single layer, the gate structure 18 may include multiple layers. For example, the gate structure 18 may include a gate electrode and gate insulators. Each of the gate insulators may be provided between the gate electrode and the channel layers 13. For example, the gate electrode may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer), and the gate insulators may include a silicon oxide layer and/or a high-k material (e.g., $Al_2O_3$, $HfO_2$, $ZrO_2$, $HfZrO_4$, $TiO_2$, $Sc_2O_3$ $Y_2O_3$, $La_2O_3$, $Lu_2O_3$, $Nb_2O_5$ or $Ta_2O_5$).

The first active region 12_1, the first channel layers 13_1, the first and third source/drain regions 14_1 and 14_3 and a portion of the gate structure 18 interposed between the first and third source/drain regions 14_1 and 14_3 may constitute a first transistor, and the second active region 12_2, the second channel layers 13_2, the second and fourth source/drain regions 14_2 and 14_4 and a portion of the gate structure 18 interposed between second and fourth source/drain regions 14_2 and 14_4 may constitute a second transistor.

A first insulator 10 may be provided on the isolation layer 11 and the active regions 12, and the source/drain regions 14 may be provided in the first insulator 10. The first insulator 10 may electrically isolate adjacent source drain regions 14 from each other and may electrically isolate the gate structure 18 from the source drain regions 14.

An etch stop layer 16 may be provided between directly adjacent active regions 12 (e.g., the first and second active regions 12_1 and 12_2) and on the portion of the isolation layer 11 between those active regions 12. The etch stop layer 16 may contact an upper surface of the isolation layer 11 and may contact the directly adjacent active regions 12. In some embodiments, a length of the etch stop layer 16 in the second direction Y may be similar to or the same as a length of the active region 12 in the second direction Y, as illustrated in FIG. 1. Accordingly, the etch stop layer 16 may be provided on and may contact the entire upper surface of the portion of the isolation layer 11, which is between directly adjacent active regions 12, and the etch stop layer 16 may include a portion overlapped by the gate structure 18, as illustrated in FIG. 2B. In some embodiments, the etch stop layer 16 may contact the gate structure 18 (e.g., a lower surface of the gate structure 18), as illustrated in FIG. 2B. For example, the etch stop layer 16 may include silicon nitride and/or silicon oxynitride and may have a thickness in the third direction Z in a range of 0.5 nm to 15 nm.

Referring to FIG. 2A, an uppermost surface 16U of the etch stop layer 16 may not protrude upwardly beyond a lower surface of the source/drain region 14. Accordingly, the etch stop layer 16 may not include a portion interposed between directly adjacent source/drain regions 14. When the etch stop layer 16 includes a portion interposed between directly adjacent source/drain regions 14, the parasitic capacitance between those adjacent source/drain regions 14 may increase if the etch stop layer 16 has a dielectric constant higher than a dielectric constant of the first insulator 10.

Referring to FIGS. 2A and 2B, an upper surface of the etch stop layer 16 may include a recess 16R. In some embodiments, a center 16C of the recess 16R in the first direction X may be aligned with a center 11C of the portion of isolation layer 11, which is between the active regions 12.

A front contact 22 and source/drain contacts 24 may be provided in the first insulator 10. The front contact 22 may contact the first source/drain region 14_1 and may include a portion (also referred to as a front contact plug 22P) that is between the first and second source/drain regions 14_1 and 14_2. The front contact 22 may electrically connect the first source/drain region 12_1 to a back side power distribution network (BSPDN) 60. The front contact 22 may be electrically connected to a power source having a voltage (e.g., positive voltage, zero voltage or ground voltage) through the BSPDN 60, and the first source/drain region 12_1 may be electrically connected to the power source through the front contact 22.

The source/drain contact 24 may contact the source/drain region 14. The source/drain contact 24 may electrically connect the source/drain region 14 to an element (e.g., a first conductor 42) of the BES 48.

The BES 48 may be provided on the first insulator 10. The BES 48 may be formed by the BEOL portion of a device fabrication process and/or a passivation process. The BES 48 may include a second insulator 40 and first conductors 42 in the second insulator 40. For example, the first conductors 42 may be a via contact or a wire (e.g., a metal wire). A second conductor 44 may be provided on the first conductors 42. The second conductor 44 may be a wire (e.g., a metal wire). A top layer 46 may be provided on the second conductor 44. The top layer 46 may include an insulation layer, conductive elements (e.g., a via contact and a wire) and/or a passivation layer (e.g., polyimide).

The integrated circuit device may also include a back-side insulator 50 and a back contact that may include a back contact plug 52 and a back-side power rail 54. The back-side insulator 50 may be formed on lower surfaces of the active regions 12 and the isolation layer 11. The back contact plug 52 and the back-side power rail 54 may be provided in the back-side insulator 50. The back contact plug 52 may contact the back-side power rail 54.

An upper portion of the back contact plug 52 may be between the first and second active regions 12_1 and 12_2. A width of the back contact plug 52 in the first direction X may be narrower than a distance between the first and second active regions 12_1 and 12_2 in the first direction X. Accordingly, the back contact plug 52 may be spaced apart from the first and second active regions 12_1 and 12_2. The upper portion of the back contact plug 52 may be in the isolation layer 11, and the isolation layer 11 may be interposed between the back contact plug 52 and the first active region 12_1 and between the back contact plug 52 and the second active region 12_2.

The front contact plug 22P (e.g., a lower surface of the front contact plug 22P) may contact the back contact plug 52 (e.g., an upper surface of the back contact plug 52). In some embodiments, an interface between the front contact plug 22P and the back contact plug 52 may be in the etch stop layer 16, and a portion (e.g., a lower portion) of the front contact plug 22P and a portion (e.g., an upper portion) of the back contact plug 52 may be in the etch stop layer 16, as illustrated in FIG. 2A. In some embodiments, a width of the front contact plug 22P in the first direction X may not be uniform along the third direction Z and may increase with increasing distance from the back contact plug 52 in the third direction Z. The width of the back contact plug 52 in the first direction X may not be uniform along the third direction Z and may increase with increasing distance from the front contact plug 22P in the third direction Z.

Referring back to FIG. 1, a widest width of the back-side power rail 54 in the second direction Y may be wider than a widest width of the back contact plug 52 in the second direction Y. In some embodiments, the back-side power rail 54 may extend longitudinally in the second direction Y, and the width of the back-side power rail 54 in the second direction Y may be wider than a width of the first active region 12_1 in the second direction Y.

The integrated circuit device may include multiple back-side power rails 54 that are electrically connected to the BSPDN 60. The BSPDN 60 may include insulating layers and conductive elements (e.g., a via contact and a wire).

Each of the isolation layer 11, the first insulator 10, the second insulator 40 and the back-side insulator 50 may include, for example, silicon oxide, silicon nitride, silicon oxynitride and/or low-k material. The low-k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

Each of the front contact 22, the source/drain contact 24, the first conductor 42, the second conductor 44, the back contact plug 52 and the back-side power rail 54 may include, for example, Al, W, Co, Ru and/or Mo.

Figure 3:
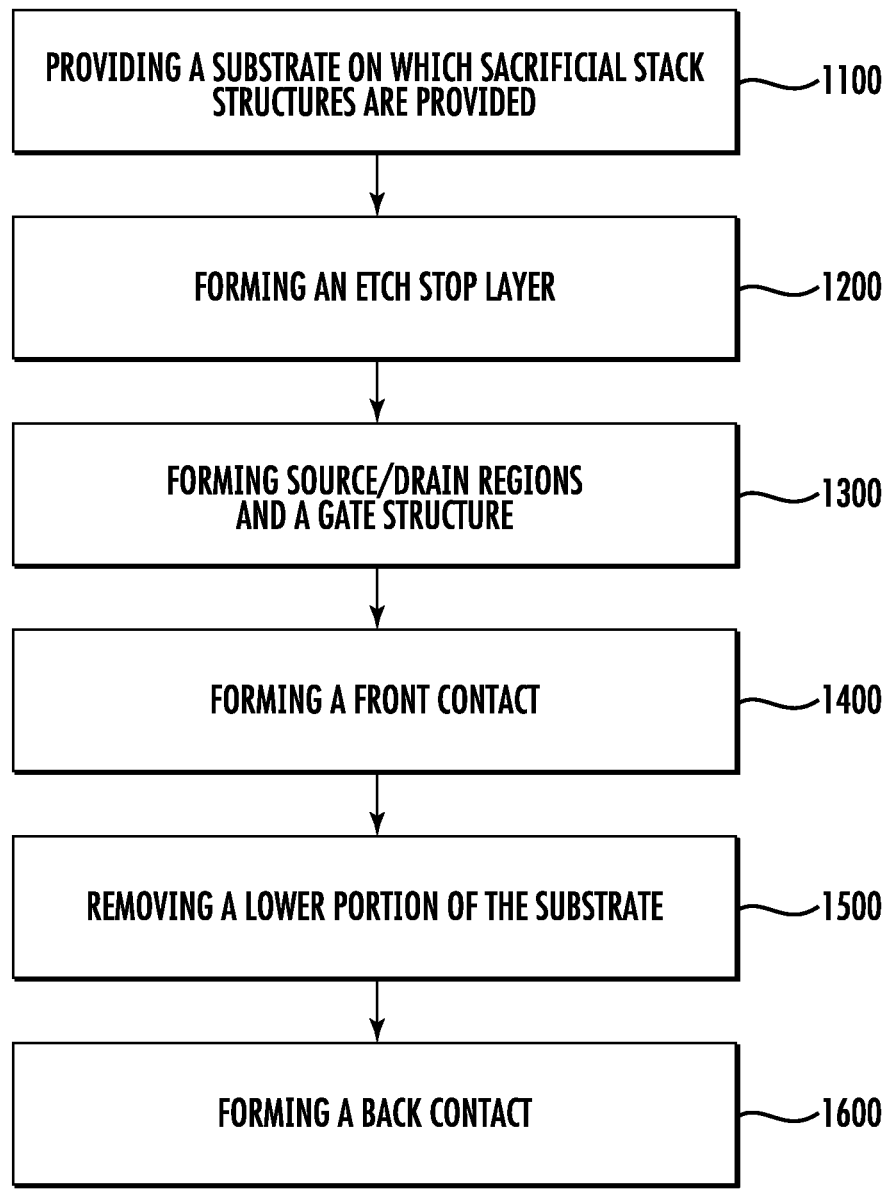
FIG. 3 is a flow chart of methods of forming an integrated circuit device according to some embodiments.

FIG. 3 is a flow chart of methods of forming an integrated circuit device according to some embodiments. FIGS. 4 through 12, 13A, 13B and 14 through 21 are views illustrating methods of forming an integrated circuit device according to some embodiments. Specifically, FIGS. 4 through 9, 11, 13A and 14 through 21 are cross-sectional views taken along the line A-A in FIG. 1, FIG. 13B is a cross-sectional view taken along the line B-B in FIG. 1, and FIGS. 10 and 12 are plan views.

Figure 4:
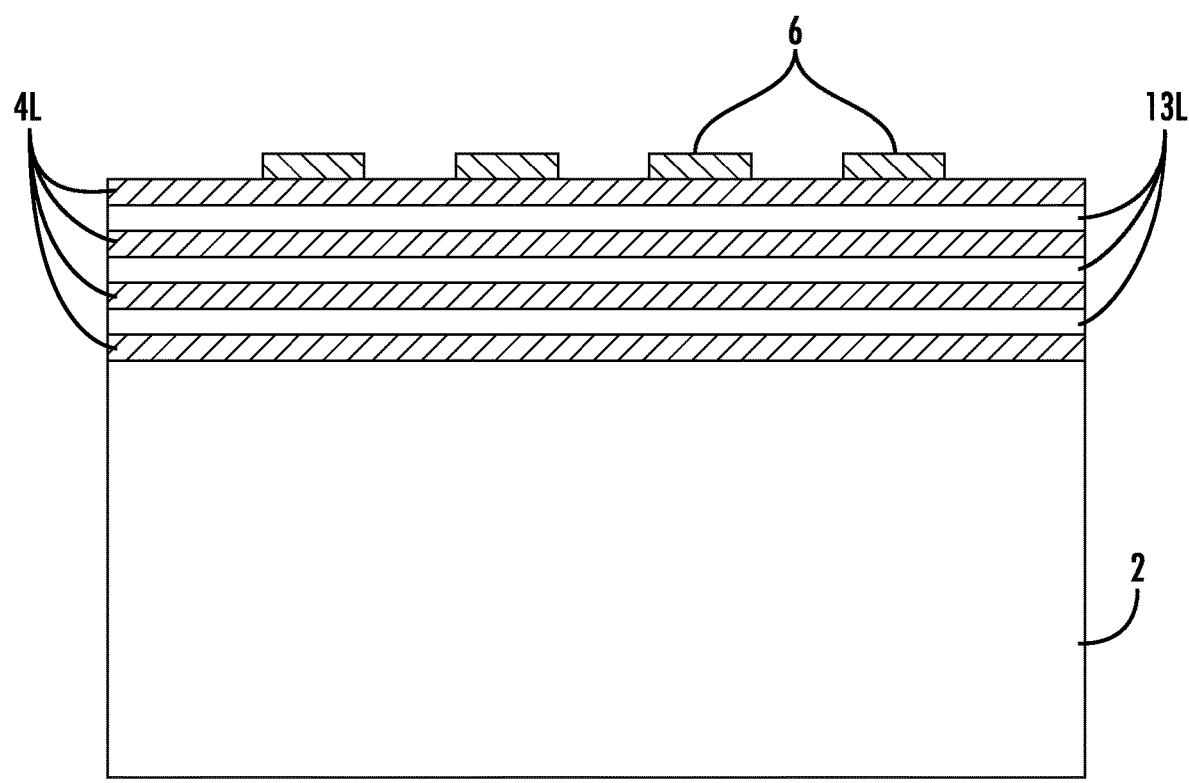
FIGS. 4 through 12, 13A, 13B and 14 through 21 are views illustrating methods of forming an integrated circuit device according to some embodiments.
Figure 5:
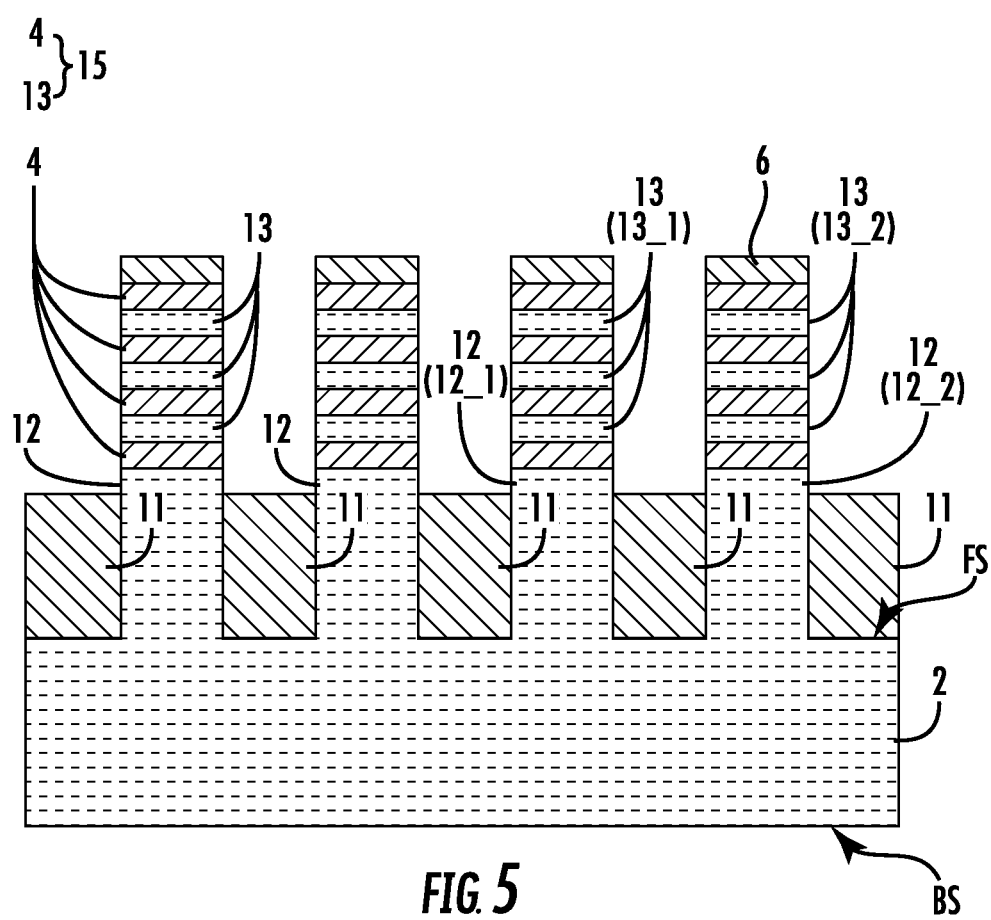

Referring to FIGS. 3 through 5, the methods may include providing a substrate on which sacrificial stack structures are provided (Block 1100). Referring to FIG. 4, preliminary channel layers 13L and preliminary sacrificial layers 4L may be formed on a substrate 2. The preliminary channel layers 13L are stacked alternately with the preliminary sacrificial layers 4L on the substrate 2. Mask patterns 6 may be formed on the preliminary sacrificial layers 4L. The preliminary sacrificial layers 4L may include a material different from the preliminary channel layers 13L and may have an etch selectivity with respect to the preliminary channel layers 13L. For example, the preliminary sacrificial layers 4L may include SiGe. The mask patterns 6 may include, for example, a photoresist material and/or a hard mask material (e.g., silicon nitride).

Referring to FIG. 5, the preliminary channel layers 13L, the preliminary sacrificial layers 4L and the substrate 2 may be etched using the mask patterns 6 as an etch mask to form active regions 12 that protrude from a front surface FS of the substrate 2 and to form sacrificial stacked structures 15, each of which includes channel layers 13 and sacrificial layers 4. An isolation layer 11 may be formed between directly adjacent active regions 12. The substrate 2 may include a back side BS opposite the front side FS. The sacrificial stacked structures 15 may contact upper surfaces of the active regions 12, respectively.

Figure 6:
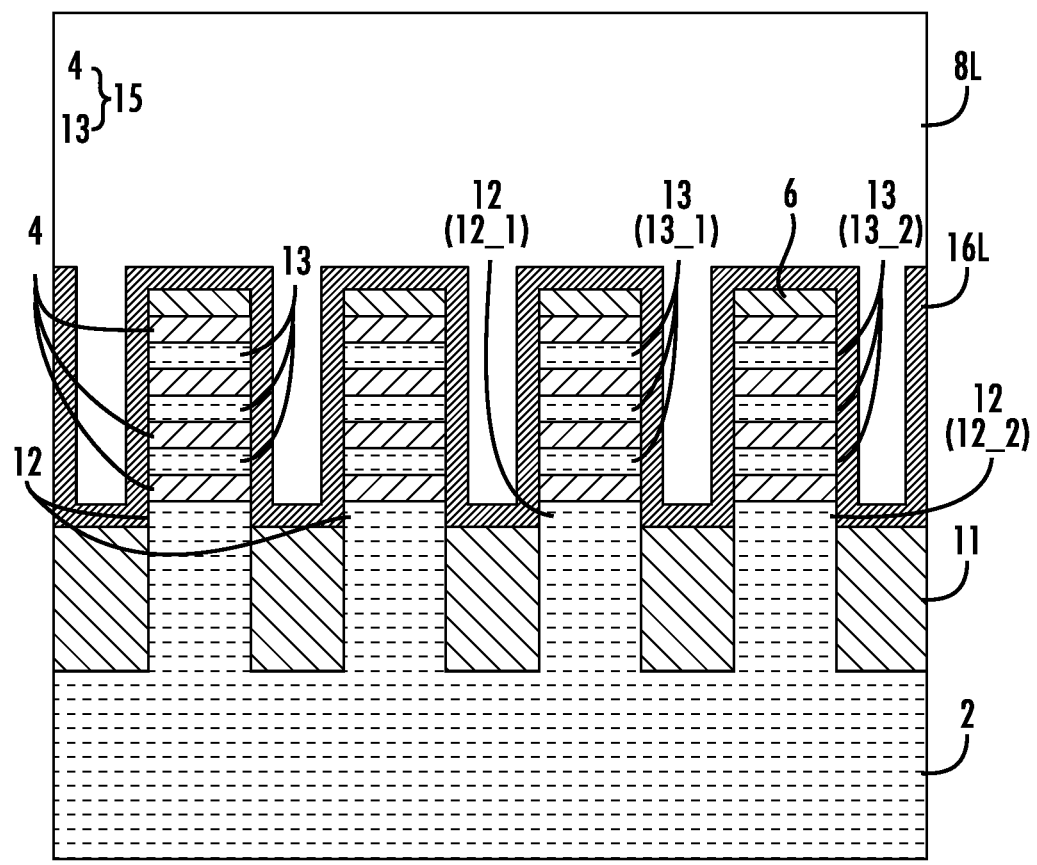

Referring to FIGS. 3 and 6 through 9, an etch stop layer may be formed (Block 1200). Referring to FIG. 6, a preliminary etch stop layer 16L may be formed on the structure shown in FIG. 5. The preliminary etch stop layer 16L may be formed on surfaces (e.g., a upper surface and opposing side surfaces) of the sacrificial stacked structures 15 and on an upper surface of the isolation layer 11. In some embodiments, the preliminary etch stop layer 16L may have a uniform thickness along the surfaces of the sacrificial stacked structures 15 and the upper surface of the isolation layer 11. The preliminary etch stop layer 16L may contact the surfaces of the sacrificial stacked structures 15 and the upper surface of the the isolation layer 11. The preliminary etch stop layer 16L may not completely fill a space between the sacrificial stacked structures 15 and may define a space between the sacrificial stacked structures 15.

A preliminary filler layer 8L may be formed on the preliminary etch stop layer 16L. The preliminary filler layer 8L may fill the space between the sacrificial stacked structures 15, which is defined by the preliminary etch stop layer 16L. The preliminary filler layer 8L may be a material that can be formed by a coating process (e.g., a spin coating process) such that the preliminary filler layer 8L may fill the space even when the space is narrow. For example, the preliminary filler layer 8L may include a material including carbon and may have an etch selectivity with respect to the preliminary etch stop layer 16L, the channel layers 13 and the sacrificial layers 4.

Figure 7:
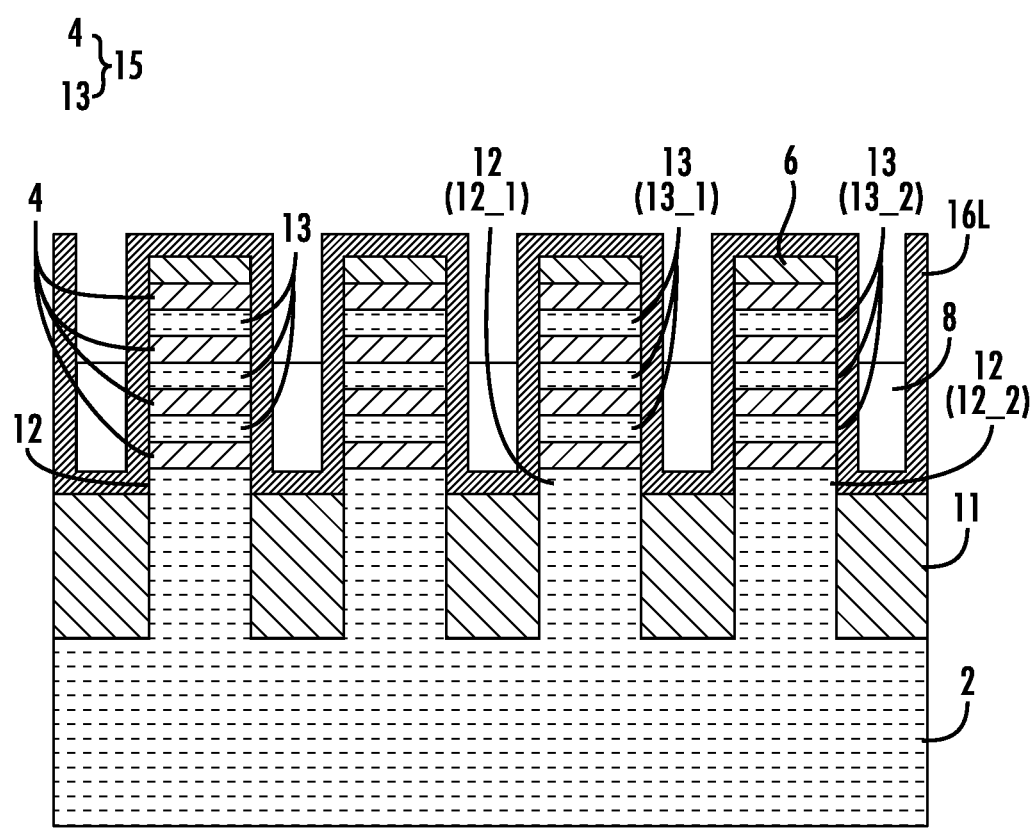

Referring to FIG. 7, an upper portion of the preliminary filler layer 8L may be removed by a process (e.g., a dry etch process, a wet etch process and/or a chemical mechanical polishing (CMP) process) to form a filler layer 8. An upper surface of the filler layer 8 may be lower than an uppermost portion of the preliminary etch stop layer 16L and upper surfaces of the sacrificial stacked structures 15. Accordingly, a portion of the preliminary etch stop layer 16L and portions of the sacrificial stacked structures 15 may protrude upwardly beyond the upper surface of the filler layer 8.

Figure 8:
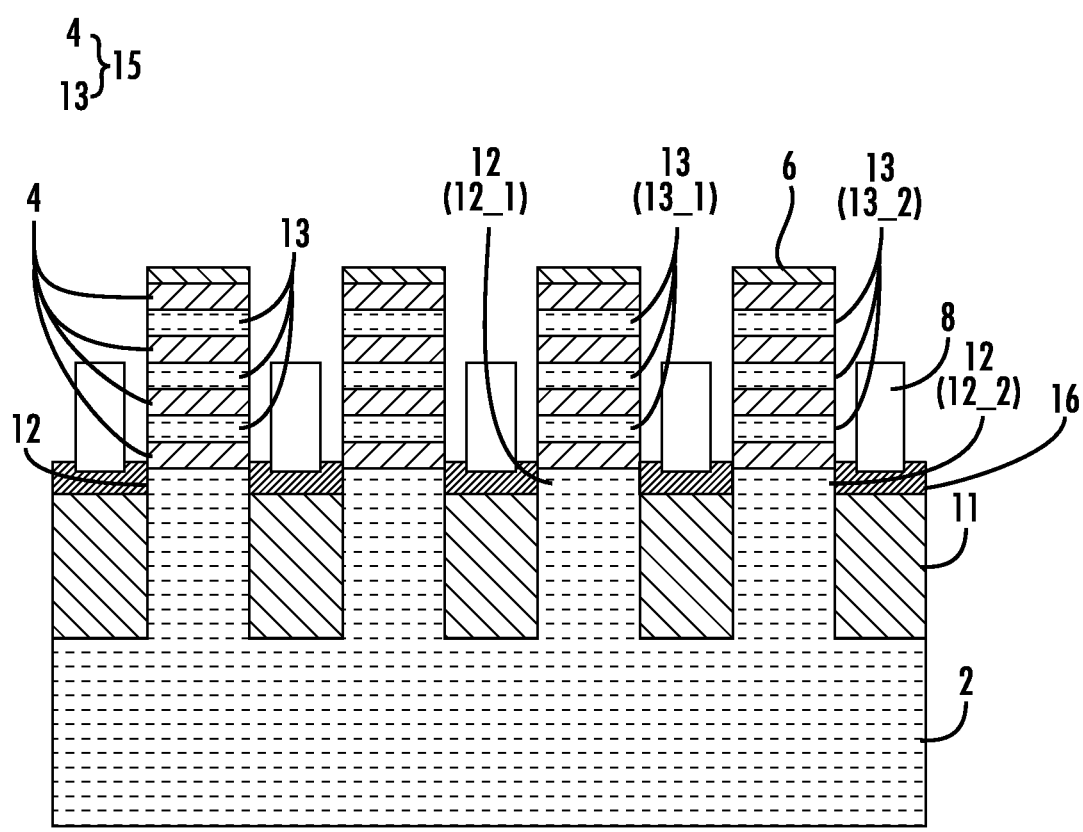

Referring to FIG. 8, the preliminary etch stop layer 16L may be etched to form an etch stop layer 16. A portion of the preliminary etch stop layer 16L under the filler layer 8 may not be etched. The etch stop layer 16 may expose opposing side surfaces of the sacrificial stacked structures 15. In some embodiments, the preliminary etch stop layer 16L may be etched until the entire opposing side surfaces of the sacrificial stacked structures 15 are exposed.

Figure 9:
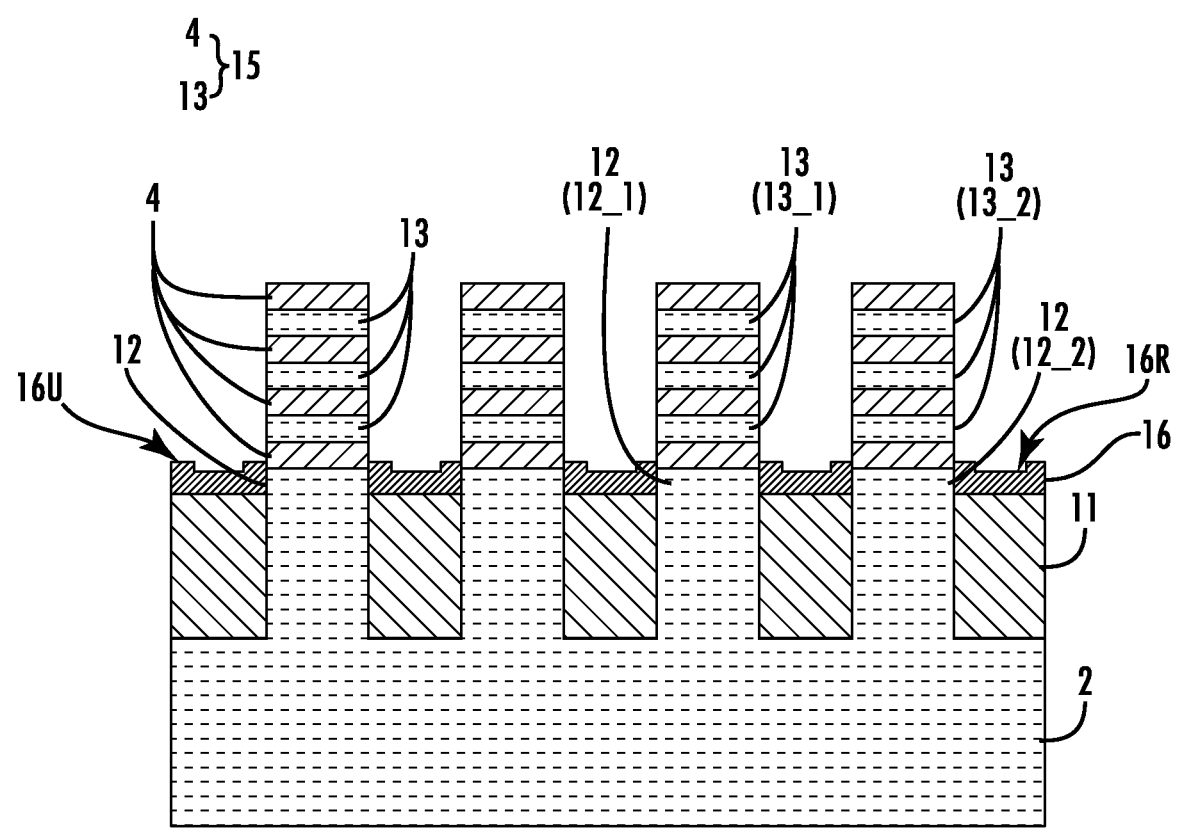
Figure 10:
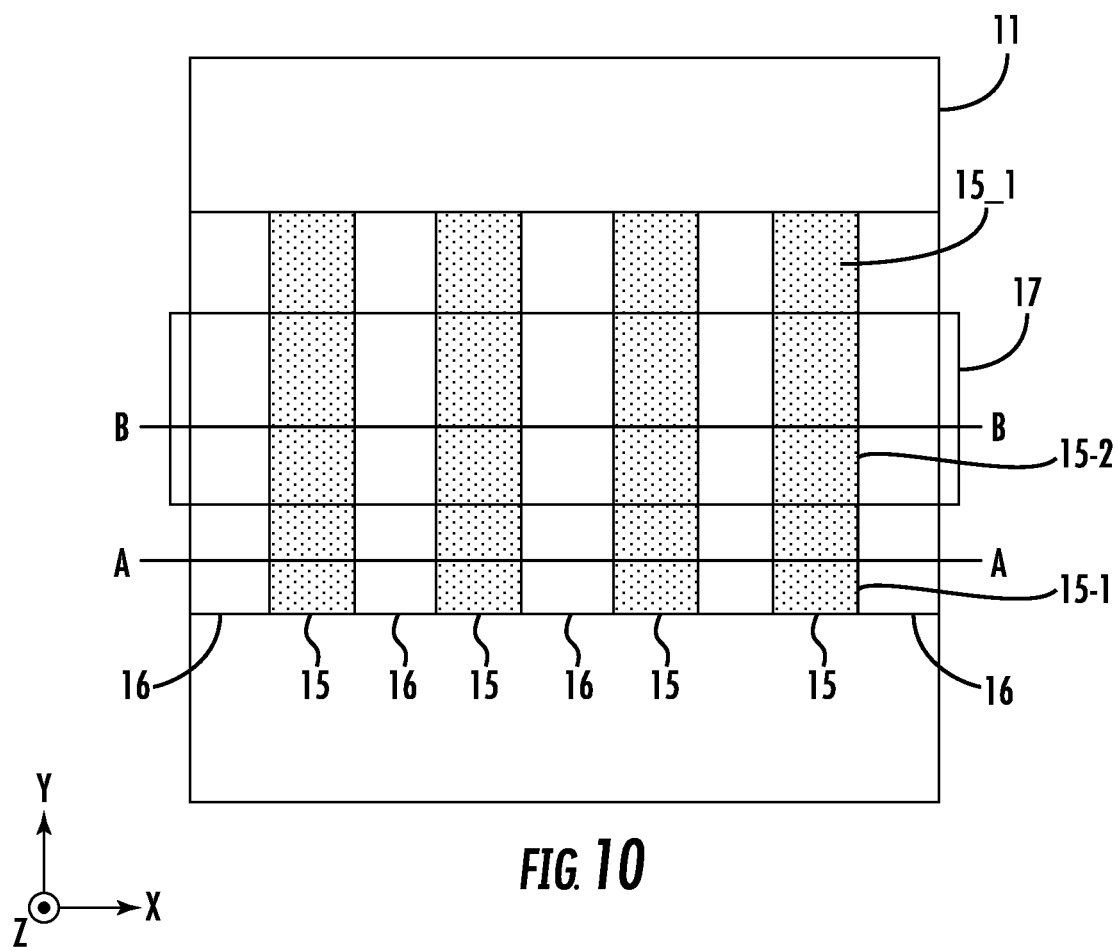

Referring to FIG. 9, the filler layer 8 may be removed. In some embodiments, an etch process for the preliminary etch stop layer 16L may stop while an uppermost surface of the preliminary etch stop layer 16L is higher than a lower surface of the filler layer 8. Accordingly, an uppermost surface of the etch stop layer 16 may be higher than a lower surface of the filler layer 8 as illustrated in FIG. 8. Accordingly, an upper surface of the etch stop layer 16 may include a recess 16R. The etch stop layer 16 may include an uppermost end 16U that is not farther than upper surfaces of the active regions 12 from the substrate 2, and thus the etch stop layer 16 may not include a portion interposed between the source/drain regions 14.

Referring to FIGS. 3 and 10 through 12, 13A and 13B, source/drain regions and a gate structure may be formed (Block 1300). Referring to FIG. 10, a mask layer 17 may be formed on the sacrificial stacked structures 15. The mask layer 17 may expose first portions 15_1 of the sacrificial stacked structures 15 and may cover second portions 15_2 of the sacrificial stacked structures 15. In some embodiments, the sacrificial stacked structures 15 and the etch stop layer 16 may have the same or similar width in the second direction Y, as illustrated in FIG. 10.

Figure 11:
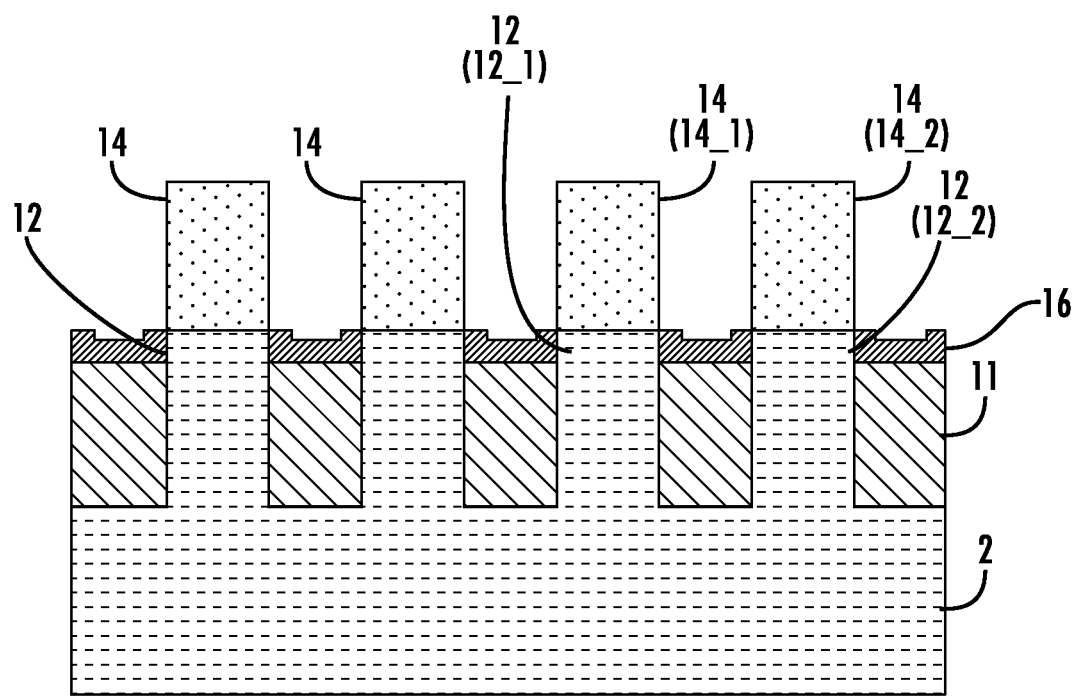
Figure 12:
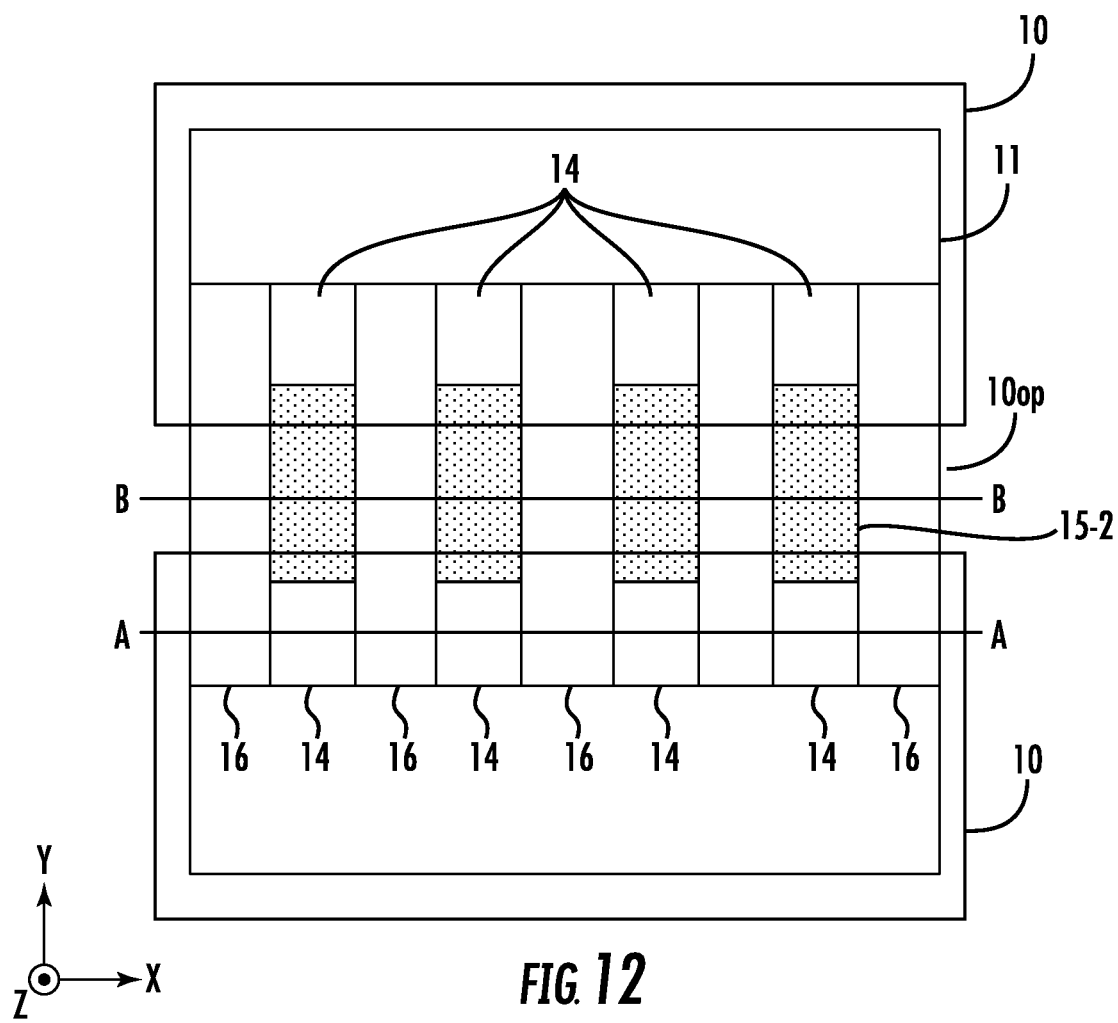

Referring to FIG. 11, the first portions 15_1 of the sacrificial stacked structures 15 may be replaced with source/drain regions 14. For example, the first portions 15_1 of the sacrificial stacked structures 15 may be etched to expose the second portions 15_2 (e.g., sidewalls of the second portions 15_2) of the sacrificial stacked structures 15, and then the source/drain regions 14 may be formed by an epitaxial growth process using channel layers 13 of the second portions 15_2 of the sacrificial stacked structures 15 as a seed layer.

Figure 13A:
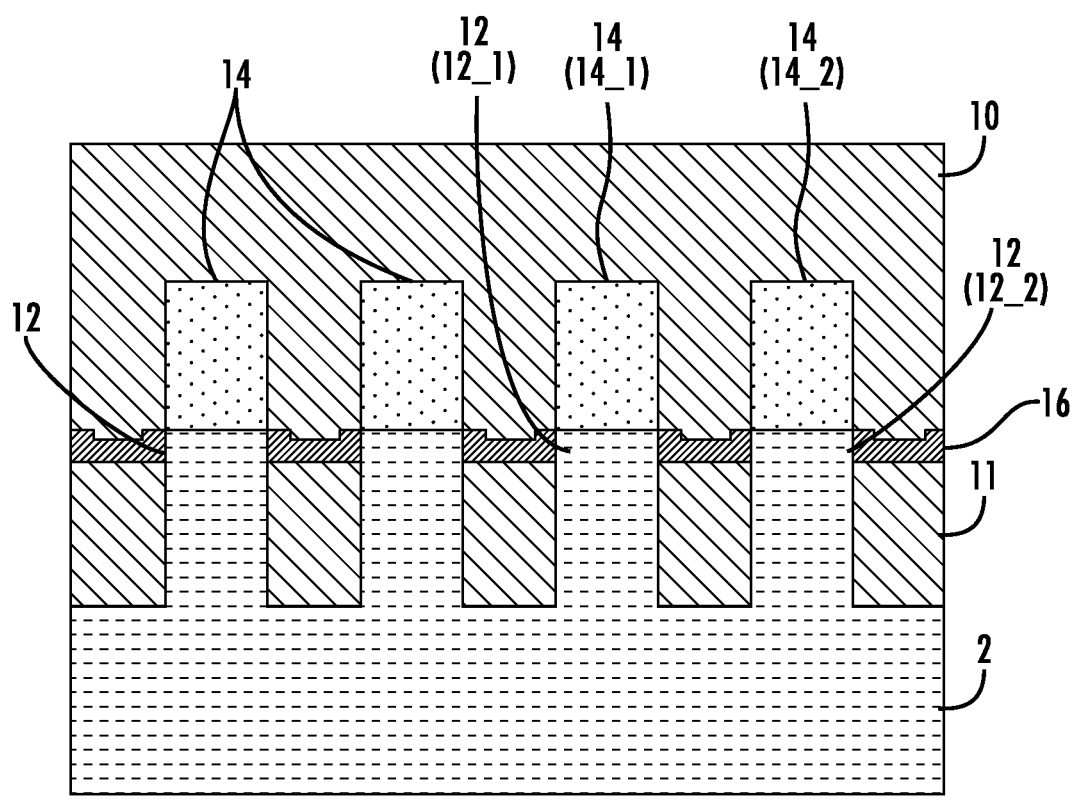
Figure 13B:
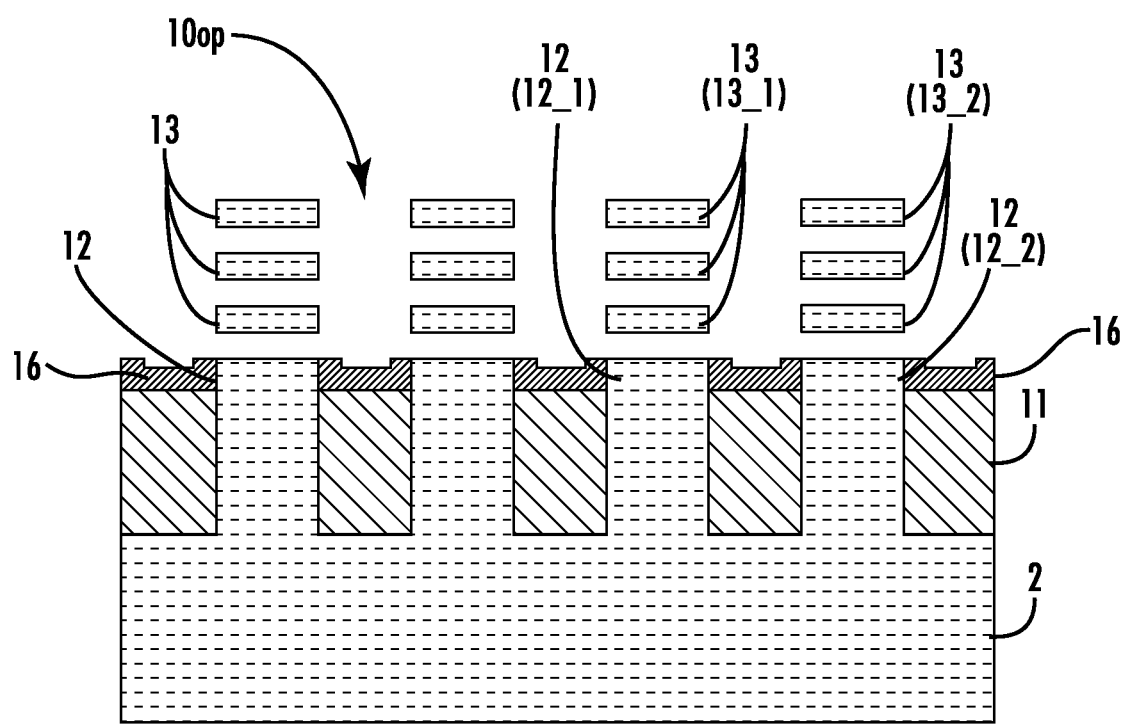

Referring to FIGS. 12, 13A and 13B, a first insulator 10 may be formed on the source/drain regions 14. The first insulator 10 may include a gate opening 10op that exposes portions of the second portions 15_2 of the sacrificial stacked structures 15. The sacrificial layers 4 of the second portions 15_2 of the sacrificial stacked structures 15 may be removed through the gate opening 10op such that the channel layers 13 of the second portions 15_2 of the sacrificial stacked structures 15 and the etch stop layer 16 may be exposed to gate opening 10op as illustrated in FIG. 13B. Referring back to FIG. 2B, the gate structure 18 may be formed in the gate opening 10op.

Figure 14:
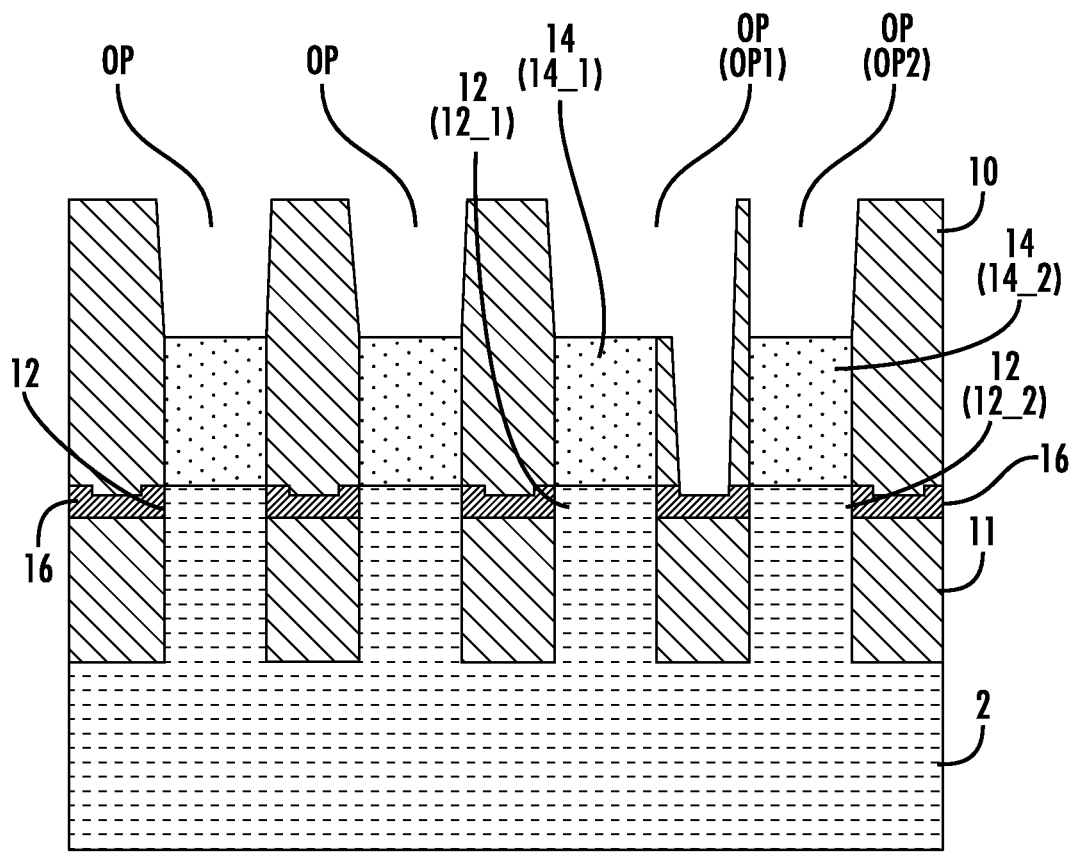

Referring to FIGS. 3 and 14 through 16, a front contact may be formed (Block 1400). Referring to FIG. 14, openings OP may be formed in the first insulator 10. Openings OP may be formed by etching the first insulator 10 and a portion of the etch stop layer 16. The openings OP may include a first opening OP1 exposing the first source/drain regions 14_1 and a second opening OP2 exposing the second source/drain regions 14_2. The first opening OP1 may be formed by etching the first insulator 10 until the etch stop layer 16 is exposed, and then a portion of the etch stop layer 16 may be etched. Accordingly, the etch stop layer 16 may serve as an etch stop layer while forming the first opening OP1. In some embodiments, the first opening OP1 may expose the etch stop layer 16, and the etch stop layer 16 may define a lower portion of the first opening OP1, as illustrated in FIG. 14. Although not shown in FIG. 14, etch mask patterns may be formed on the first insulator 10 to cover portions of the first insulator 10 while forming the openings OP, and the etch mask patterns may be removed after the openings OP are formed. Etchant(s) and process conditions, which allow selectively etching the first insulator 10 with respect to the source/drain regions 14, may be used such that the source/drain regions 14 may not be etched while forming the openings OP.

Figure 15:
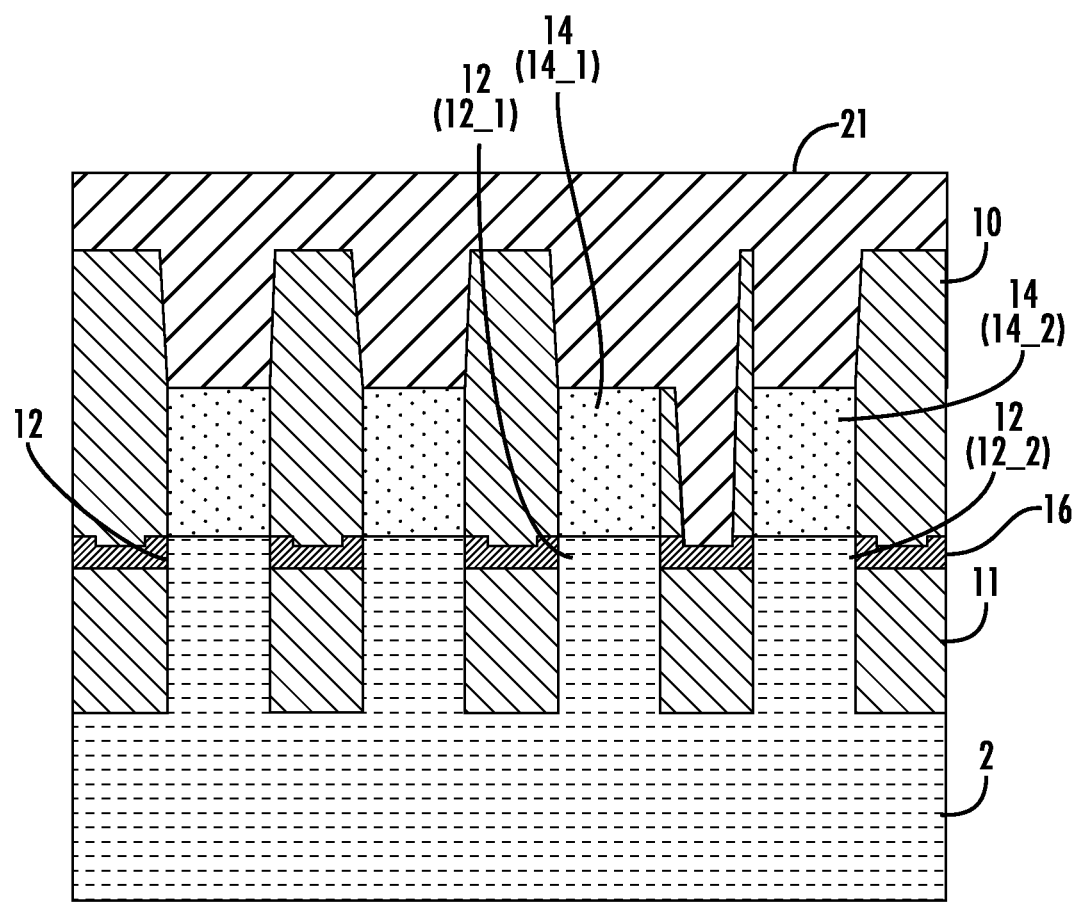

Referring to FIG. 15, a conductive layer 21 may be formed in the openings OP and on the first insulator 10. Although the conductive layer 21 is illustrated as a single layer, in some embodiments, the conductive layer 21 may include multiple layers sequentially formed on the first insulator 10. For example, the conductive layer 21 may include an adhesion layer (e.g., a conductive layer including W, Cr, Ti and/or Ni) a barrier layer (e.g., a conductive layer including TiN, TaN and/or AlN) and/or a metal layer sequentially formed on the first insulator 10.

Figure 16:
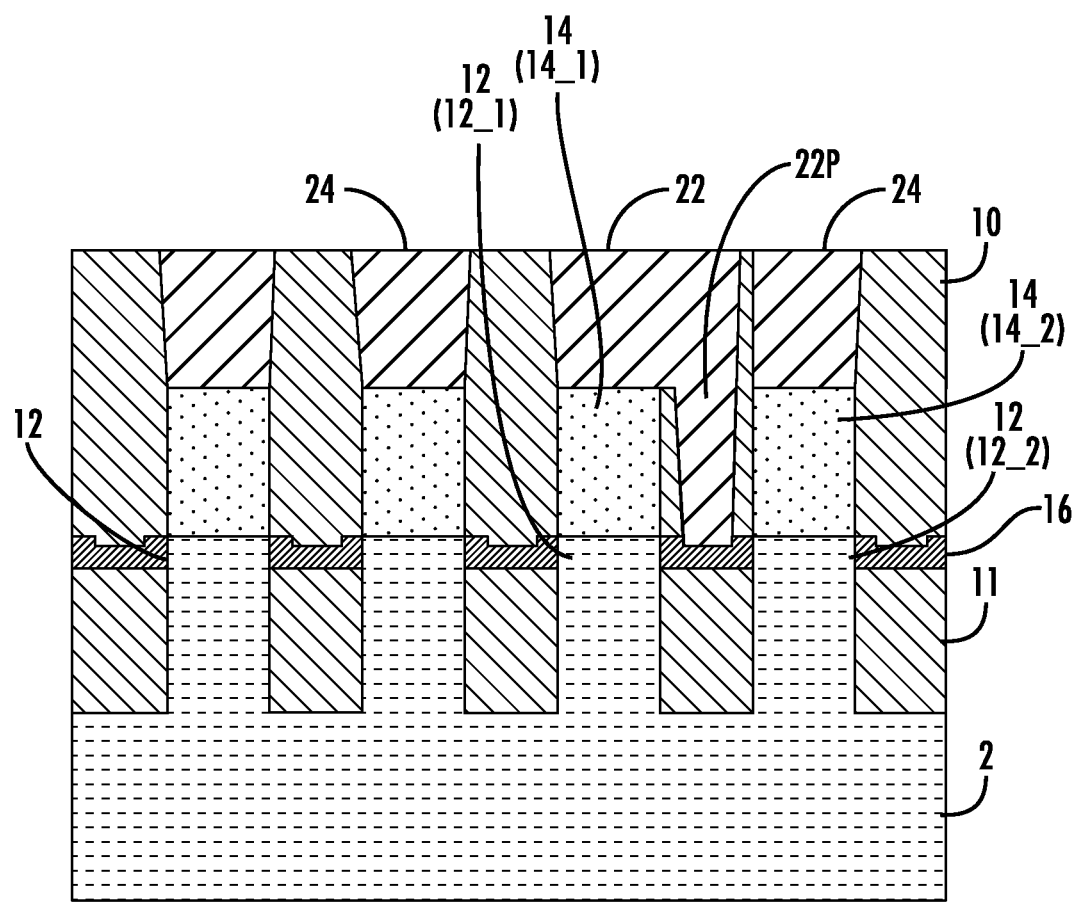

Referring to FIG. 16, the conductive layer 21 may be removed until the first insulator 10 is exposed to form the front contact 22 and source/drain contacts 24. The conductive layer 21 may be removed by an etch process and/or a CMP process. In some embodiments, upper surfaces of the front contact 22 and the source/drain contacts 24 may be coplanar with each other. The front contact 22 and the source/drain contacts 24 may be formed through the same processes described with reference to FIGS. 14 through 16, rather than separate processes for each of the front contact 22 and the source/drain contacts 24. Accordingly, the MOL portion of device fabrication may be relatively simple.

Figure 17:
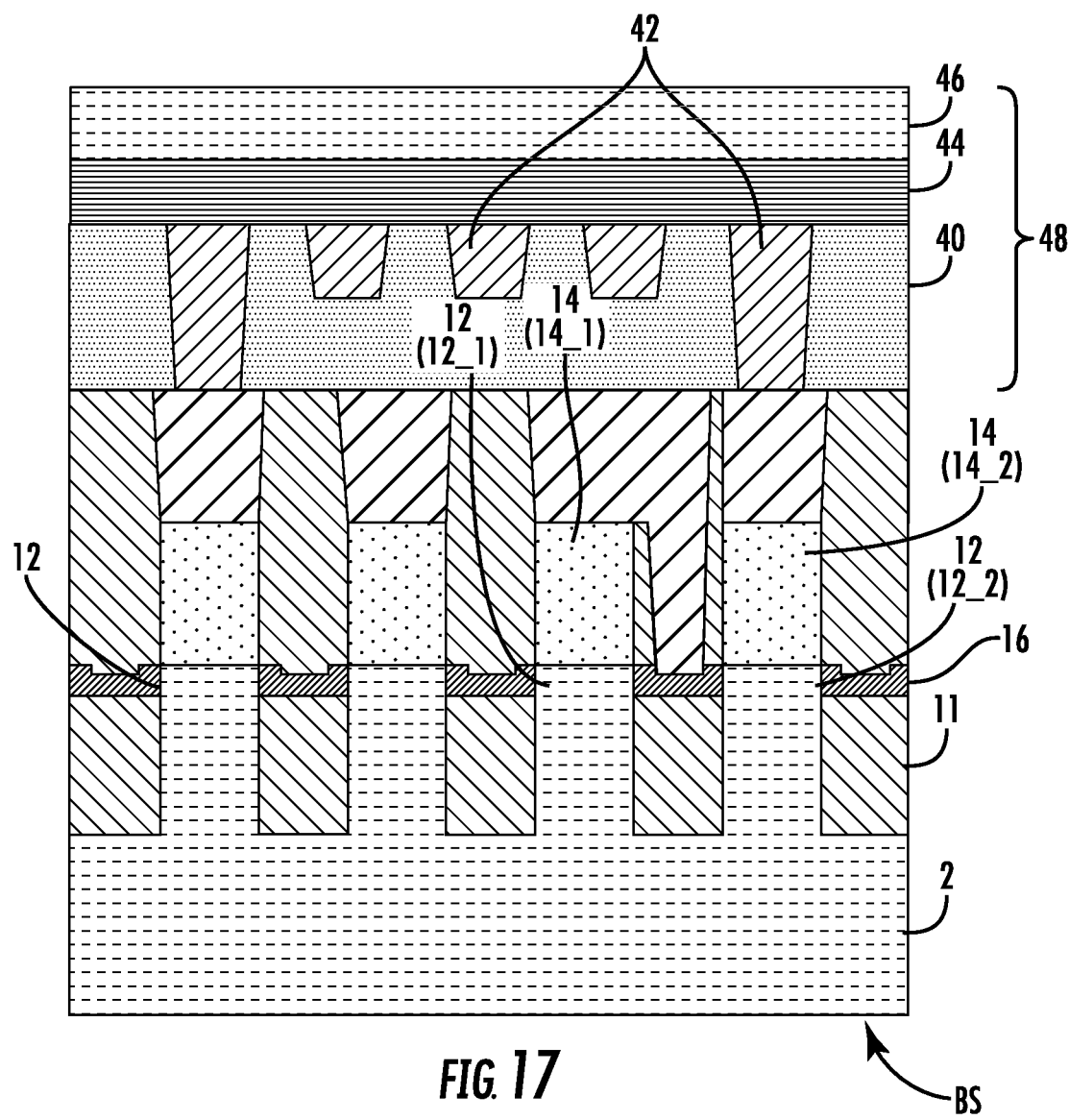

Referring to FIG. 17, a BES 48 structure may be formed on the front contact 22 and the source/drain contacts 24.

Figure 18:
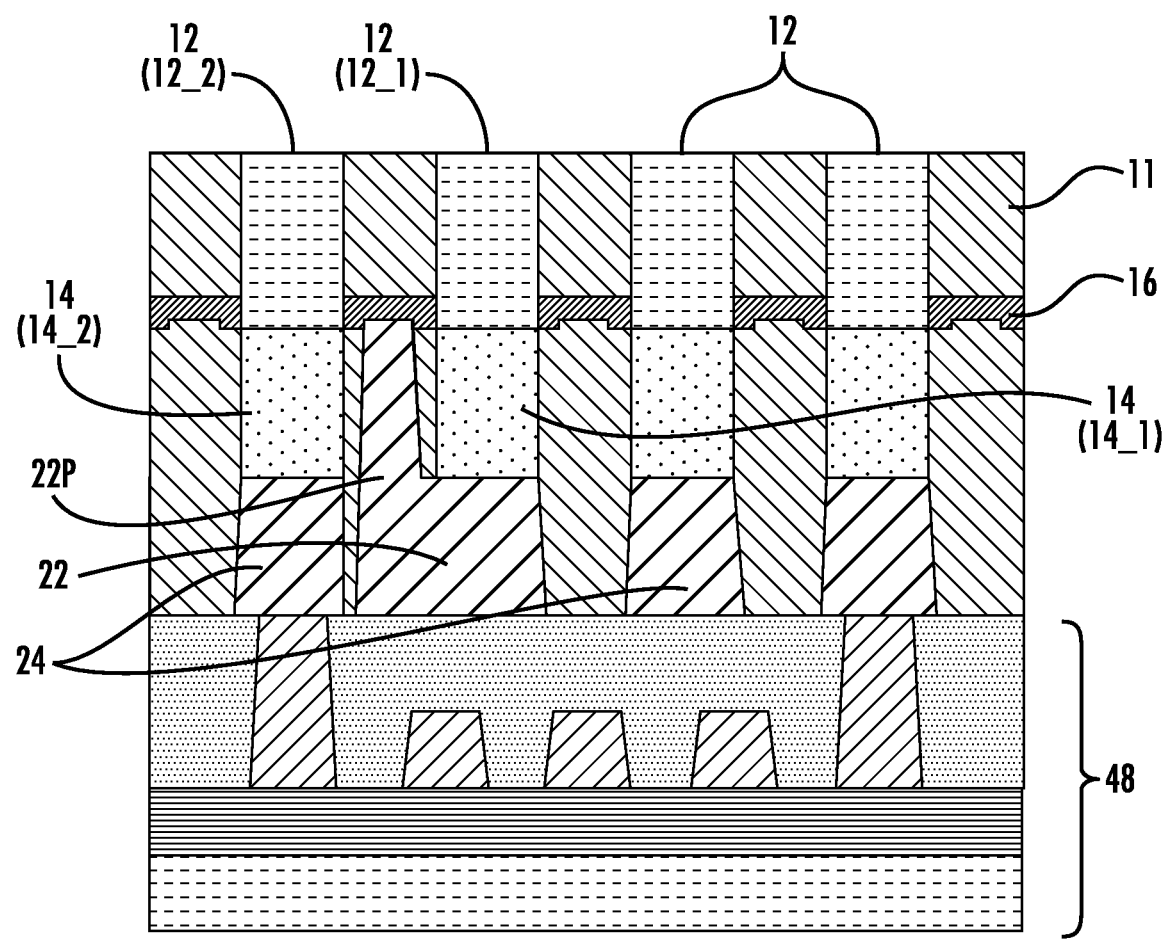

Referring to FIGS. 3 and 18, a lower portion of the substrate 2 may be removed (Block 1500). The structure shown in FIG. 17 may be turned around (e.g., flipped), and a lower portion of the substrate 2 may be removed by performing, for example, a grinding process, an etch process and/or a CMP process on the back side (the back side BS in FIG. 17) of the substrate 2. The lower portion of the substrate 2 may be removed until the isolation layer 11 is exposed.

Figure 19:
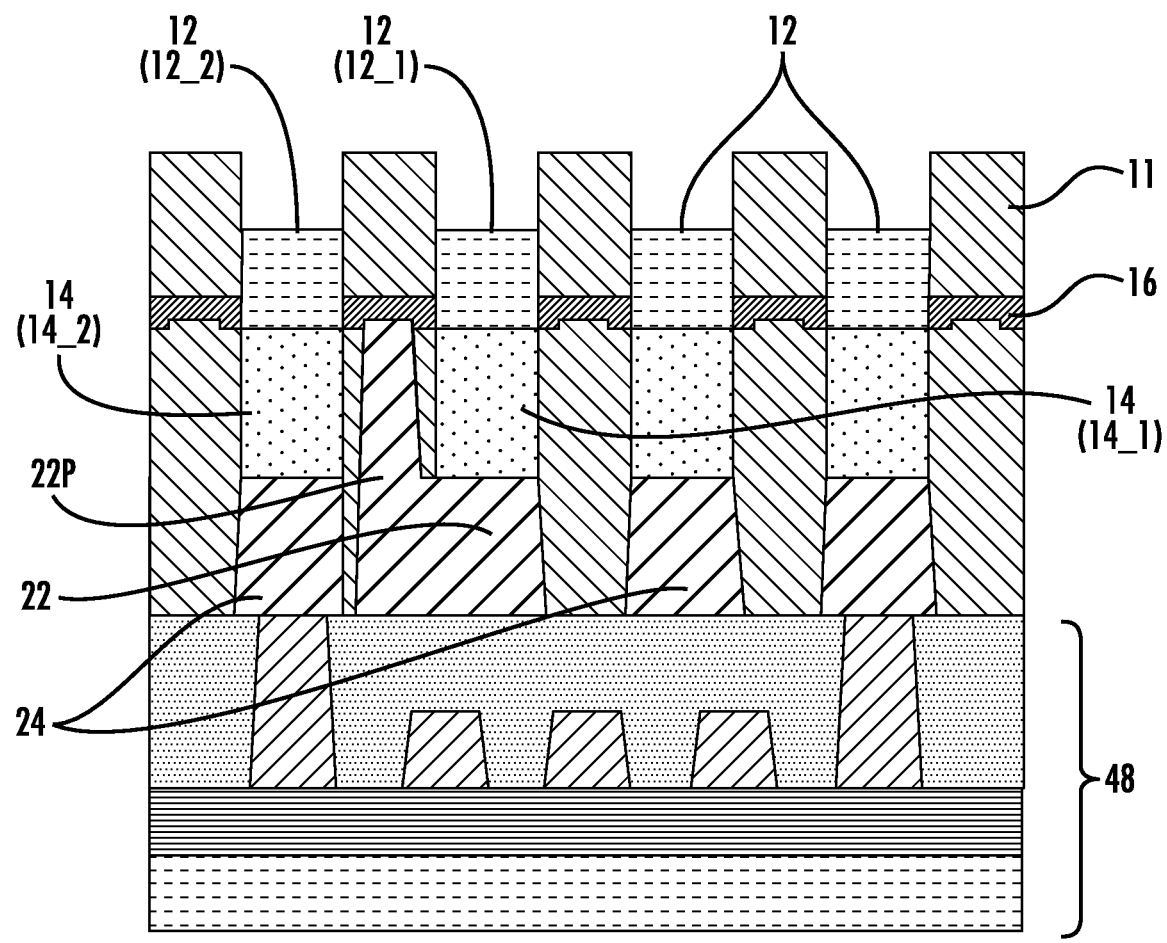

Referring to FIG. 19, in some embodiments, the active regions 12 may be etched to be recessed relative to the isolation layer 11.

Figure 20:
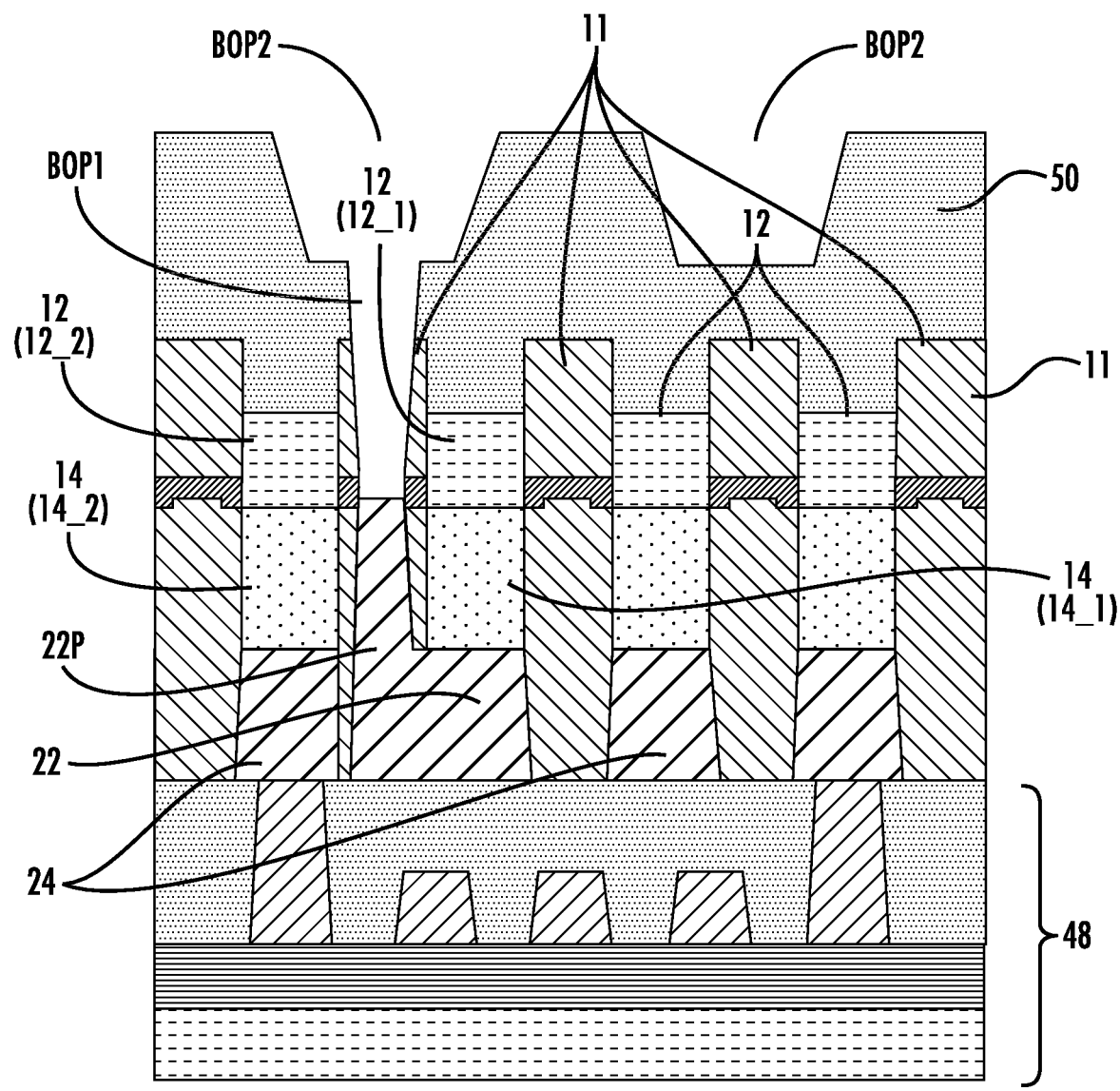
Figure 21:
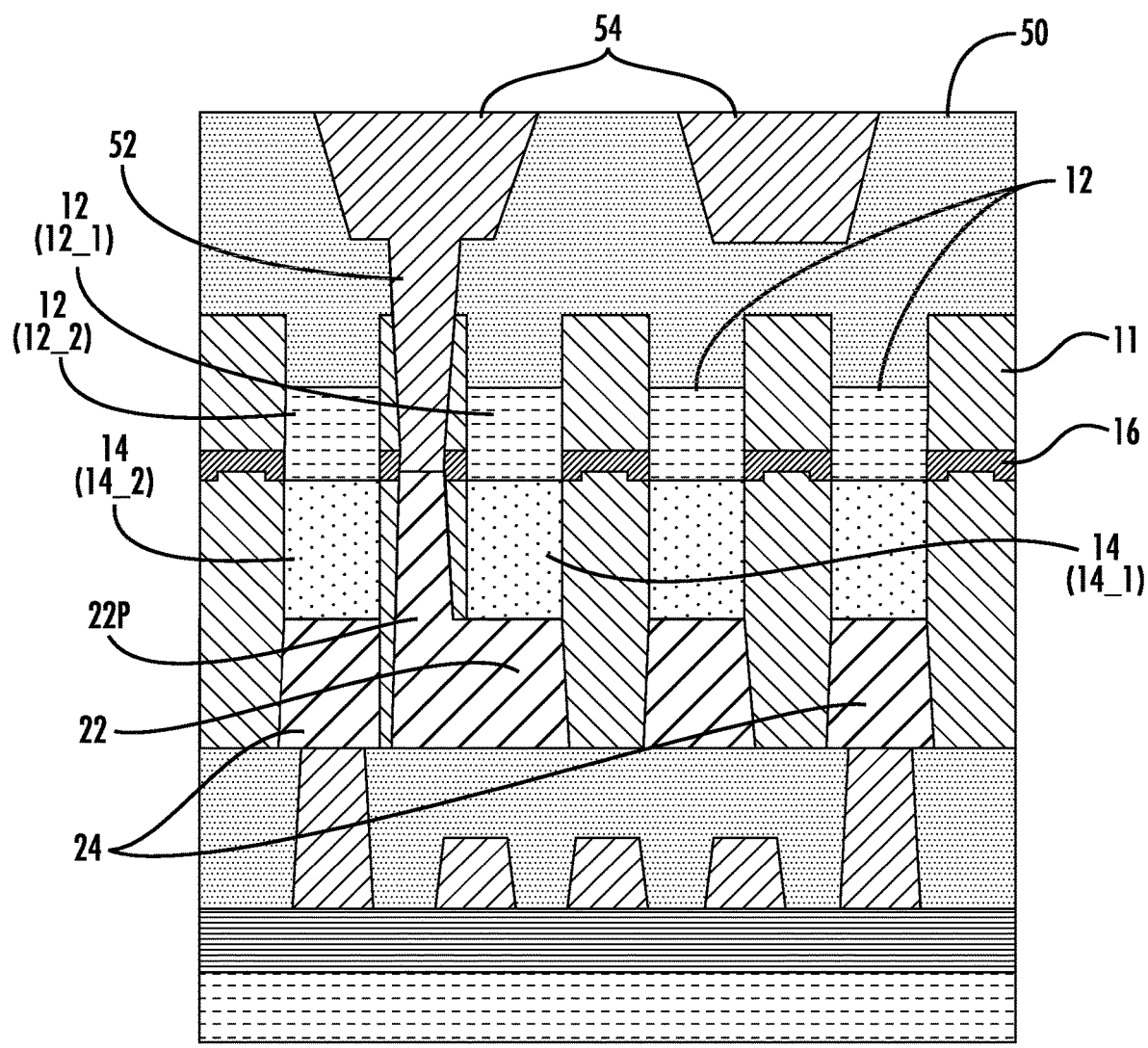

Referring to FIGS. 3, 20 and 21, a back contact may be formed (Block 1600). Referring to FIG. 20, a back-side insulator 50 may be formed on the isolation layer 11, and a back-side opening BOP1 and a line-shaped opening BOP2 may be formed in the back-side insulator 50 and the isolation layer 11. The back-side opening BOP1 may be connected to the line-shaped opening BOP2 and may be between the front contact 22 and the line-shaped opening BOP2. The back-side opening BOP1 may be formed by etching the back-side insulator 50 and the isolation layer 11 until the etch stop layer 16 is exposed, and then a portion of the etch stop layer 16 may be etched until the front contact plug 22p is exposed. Accordingly, the etch stop layer 16 may also serve as an etch stop layer while forming the back-side opening BOP1. In some embodiments, the back-side opening BOP1 may expose the etch stop layer 16, and the etch stop layer 16 may define a portion (e.g., an upper portion) of the back-side opening BOP1.

Referring to FIG. 21, a back contact plug 52 may be formed in the back-side opening BOP1 and a back-side power rail 54 may be formed in the line-shaped opening BOP2. The back contact plug 52 and the back-side power rail 54 may be formed by forming a conductive layer in the back-side opening BOP1 and the line-shaped opening BOP2. Although the back contact plug 52 and the back-side power rail 54 are illustrated as a single layer, in some embodiments, the back contact plug 52 and the back-side power rail 54 may include multiple layers sequentially formed on the back-side insulator 50. For example, the back contact plug 52 and the back-side power rail 54 may include an adhesion layer (e.g., a conductive layer including W, Cr, Ti and/or Ni) a barrier layer (e.g., a conductive layer including TiN, TaN and/or AlN) and/or a metal layer sequentially formed on the back-side insulator 50. Referring back to FIG. 2A, a BSPDN 60 may be formed on the back-side power rail 54.

Figure 22:
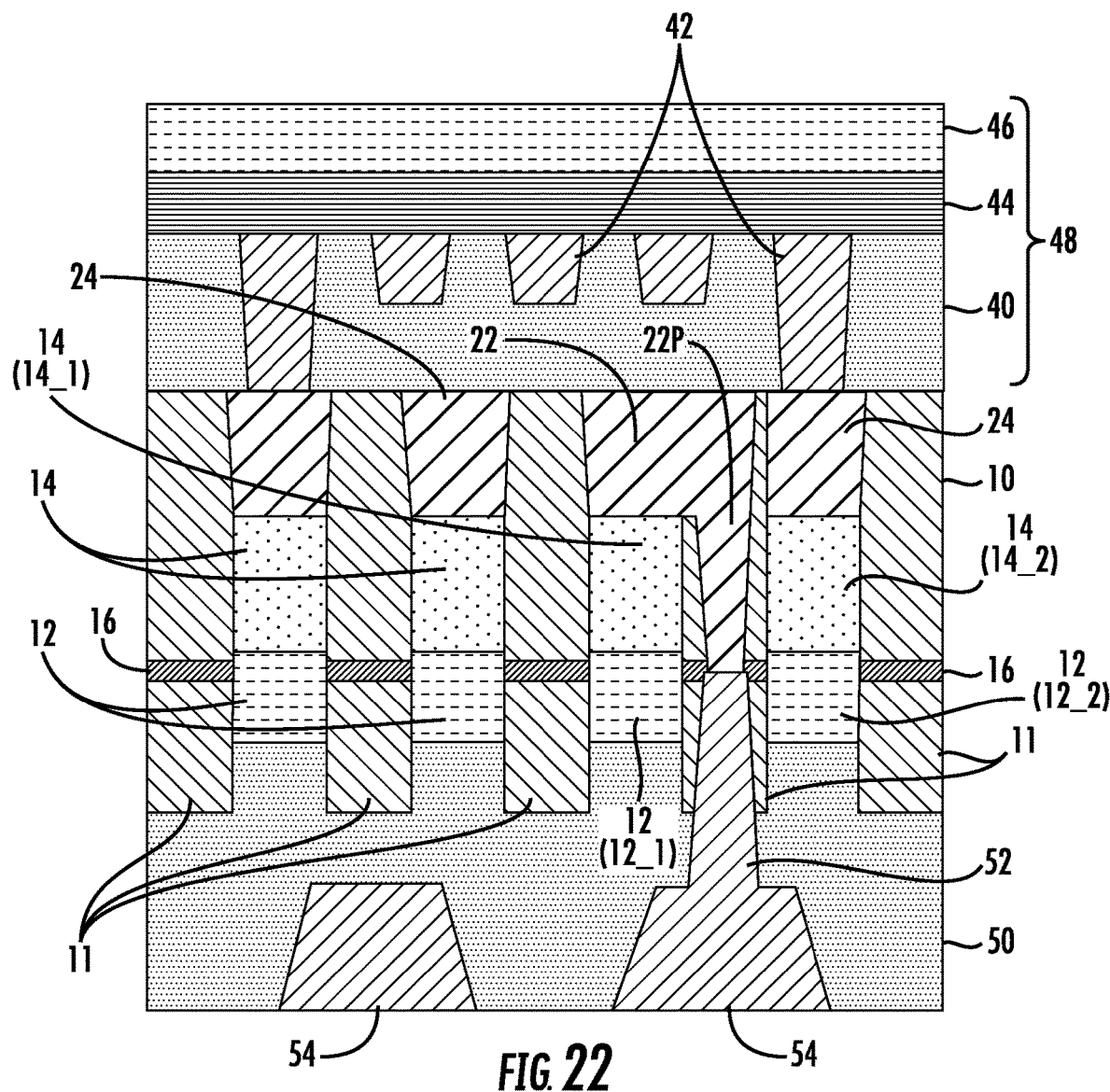
FIGS. 22 and 23 each illustrate a cross-sectional view of an integrated circuit device taken along the line A-A in FIG. 1 according to some embodiments.
Figure 23:
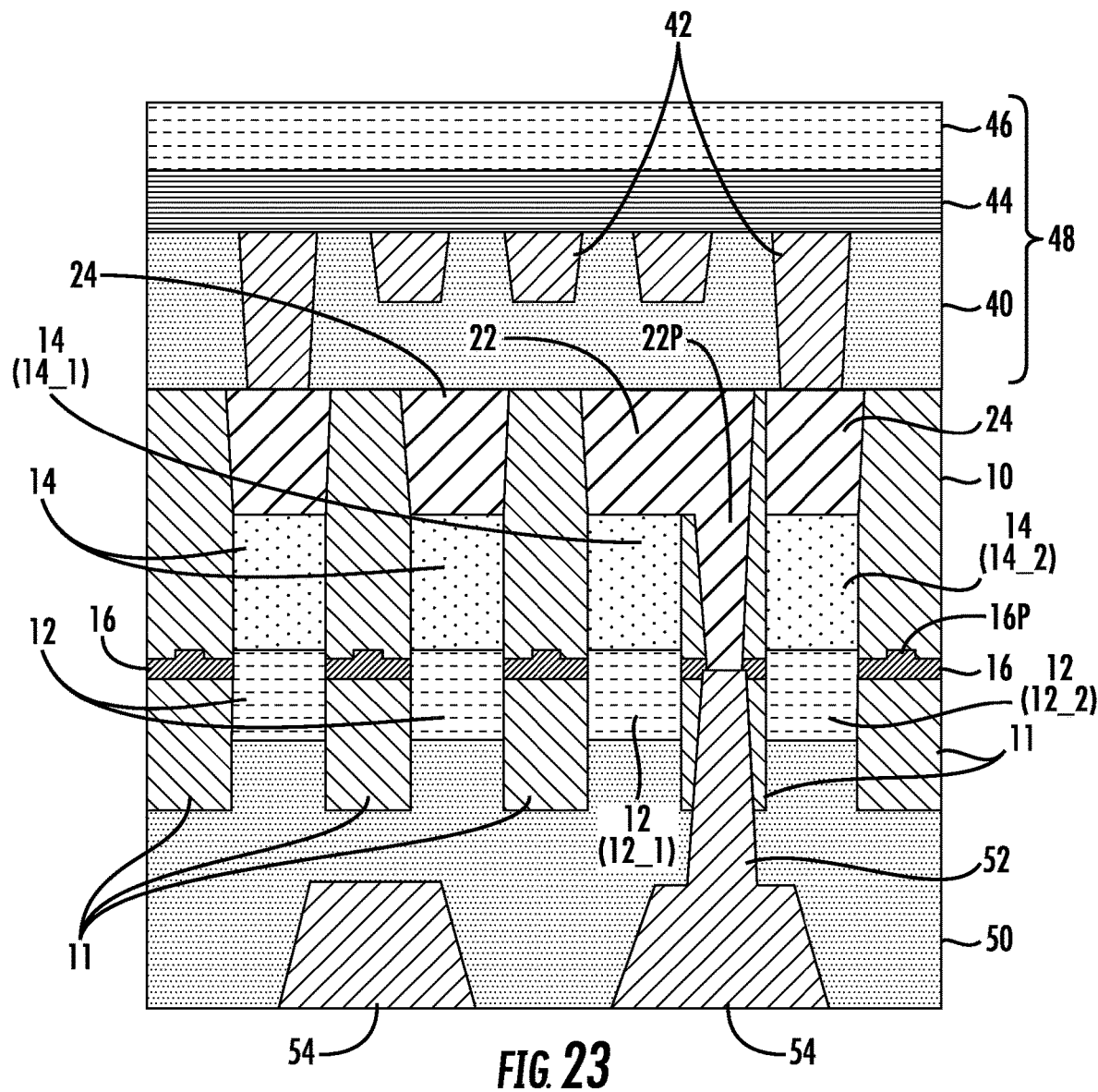

FIGS. 22 and 23 each illustrate a cross-sectional view of an integrated circuit device taken along the line A-A in FIG. 1 according to some embodiments. The structures shown in FIGS. 22 and 23 may be similar to the structure shown in FIG. 2A except for a shape of the etch stop layer 16.

Referring to FIG. 22, an upper surface of the etch stop layer 16 may be flat and may not include a recess (e.g., the recess 16R in FIG. 2A). The structures shown in FIG. 22 may be formed by etching the etch stop layer 16 until the upper surface of the etch stop layer 16 becomes coplanar with the lower surface of the filler layer 8 during the process described with reference to FIG. 8.

Referring to FIG. 23, an upper surface of the etch stop layer 16 may include a protrusion 16P protruding into the first insulator 10. The structures shown in FIG. 23 may be formed by etching the etch stop layer 16 until an upper surface of a portion of the etch stop layer 16 that is not covered by the filler layer 8 becomes lower than the lower surface of the filler layer 8 during the process described with reference to FIG. 8.

Figure 24A:
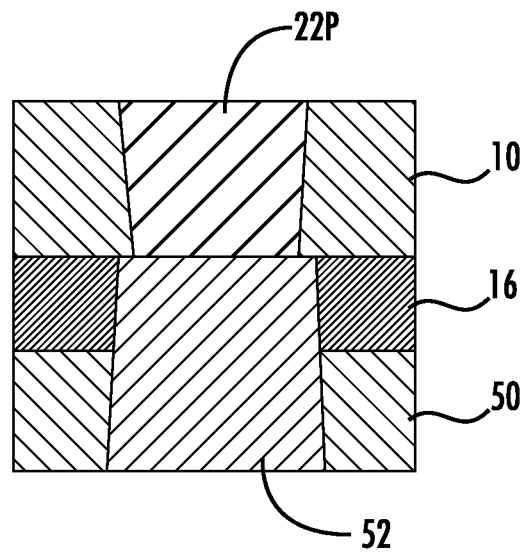
FIGS. 24A and 24B each illustrate the IR region in FIG. 1 according to some embodiments.
Figure 24B:
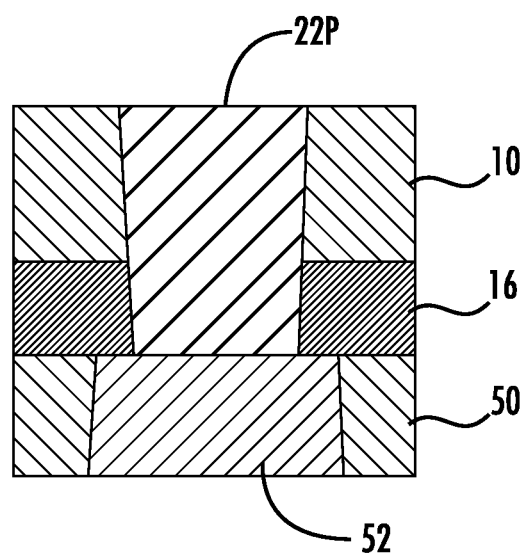

FIGS. 24A and 24B each illustrate the IR region in FIG. 2A according to some embodiments. Referring to FIG. 24A, only a portion of the back contact plug 52 may be in the etch stop layer 16, and the front contact plug 22P may not be in the etch stop layer 16. Accordingly, an interface between the front contact plug 22P and the back contact plug 52 may not be in the etch stop layer 16. The structure shown in FIG. 24A may be formed by stopping the etch process for the first insulator 10 upon exposing the etch stop layer 16 during the process described with reference to FIG. 14 such that the first opening OP1 may not be formed in the etch stop layer 16.

Referring to FIG. 24B, only a portion of the front contact plug 22P may be in the etch stop layer 16, and the back contact plug 52 may not be in the etch stop layer 16. Accordingly, an interface between the front contact plug 22P and the back contact plug 52 may not be in the etch stop layer 16. The structure shown in FIG. 24B may be formed by performing the etch process for the first insulator 10 and the etch stop layer 16 until the isolation layer 11 is exposed during the process described with reference to FIG. 14 such that the first opening OP1 may extend through the etch stop layer 16.

Integrated circuit devices according to embodiments described herein may provide various advantages. For example, a contact structure connecting an element (e.g., the source/drain region 14 in FIG. 2A) formed on a front side of a substrate and an element (e.g., the back-side power rail 54 in FIG. 2A) formed on a back side of the substrate may include two contacts that each have a relatively low aspect ratio and are formed through separate processes. Accordingly, defects associated with a high aspect ratio contact structure may be reduced. Further, a single etch stop layer (e.g., the etch stop layer 16 in FIG. 2A), rather than two separate etch stop layers, may be used as an etch stop layer during two etch processes (e.g., one for the openings OP in FIG. 14 and another for the back-side opening BOP1 in FIG. 20). Still further, an etch stop layer (e.g., the etch stop layer 16 in FIG. 2A) may not include a portion interposed between adjacent source/drain regions, and thus the etch stop layer may not increase the parasitic capacitance between those source/drain regions.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:

providing a substrate that comprises a front surface and a back surface opposite the front surface, wherein first and second active regions, an isolation layer, and first and second sacrificial stack structures are provided on the front surface of the substrate, and wherein the isolation layer is between the first and second active regions, the first and second sacrificial stack structures respectively contact upper surfaces of the first and second active regions, and the first and second sacrificial stack structures each comprise a channel layer and a sacrificial layer;

forming an etch stop layer on an upper surface of the isolation layer;

replacing portions of the first and second sacrificial stack structures with first and second source/drain regions, respectively;

forming a front contact that contacts the first source/drain region, wherein the front contact comprises a front contact plug that is between the first and second source/drain regions;

forming a back-side insulator on a lower surface of the isolation layer; and forming a back contact plug that is in the isolation layer and the back-side insulator and contacts a lower surface of the front contact plug, wherein at least one of a portion of the front contact plug and a portion of the back contact plug is in the etch stop layer.

2. The method of claim 1, wherein forming the etch stop layer comprises:

forming a preliminary etch stop layer on the first and second sacrificial stack structures and the isolation layer;

forming a preliminary filler layer on the preliminary etch stop layer;

etching the preliminary filler layer, thereby forming a filler layer between the first and second sacrificial stack structures on the preliminary etch stop layer, wherein a portion of the preliminary etch stop layer and portions of the first and second sacrificial stack structures protrude upwardly beyond an upper surface of the filler layer; and then etching the preliminary etch stop layer, thereby forming the etch stop layer and exposing side surfaces of the first and second sacrificial stack structures.

3. The method of claim 1, wherein forming the front contact comprises:

forming a first insulator on the first and second source/drain regions and the etch stop layer;

etching the first insulator and the etch stop layer, thereby forming a first opening in the first insulator, wherein the first opening exposes the etch stop layer; and forming the front contact plug in the first opening.

4. The method of claim 1, further comprising forming a source/drain contact that contacts the second source/drain region, wherein forming the front contact and the source/drain contact comprises:
  forming a first insulator on the first and second source/drain regions and the etch stop layer;
  etching the first insulator and the etch stop layer, thereby forming first and second openings in the first insulator, wherein the first and second openings expose the first and second source/drain regions, respectively, and the first opening further exposes the etch stop layer;
  forming a conductive layer in the first and second openings and on the first insulator; and
  removing the conductive layer until the first insulator is exposed, thereby forming the front contact in the first opening and forming the source/drain contact in the second opening.

5. The method of claim 1, wherein forming the back contact plug comprises:
  etching the back-side insulator and the isolation layer, thereby forming a back-side opening that is in the back-side insulator and the isolation layer; and
  forming the back contact plug in the back-side opening.

6. The method of claim 5, wherein forming the back-side opening comprises etching a portion of the etch stop layer.

7. The method of claim 1, further comprising forming a back-side power rail, wherein forming the back contact plug and the back-side power rail comprises:
  etching the back-side insulator and the isolation layer, thereby forming a line-shaped opening in the back-side insulator and forming a back-side opening that is in the back-side insulator and the isolation layer and is between the line-shaped opening and the front contact plug; and
  forming a back-side conductive layer in the back-side opening and the line-shaped opening, thereby forming the back contact plug in the back-side opening and forming the back-side power rail in the line-shaped opening.

8. The method of claim 1, further comprising, after forming the front contact plug and before forming the back-side insulator, removing a lower portion of the substrate until the lower surface of the isolation layer is exposed.

9. The method of claim 1, wherein the portions of the first and second sacrificial stack structures are first portions, and the first and second sacrificial stack structures each further comprise a second portion, and the method further comprises forming a gate structure crossing over the first and second active regions and the etch stop layer, wherein forming the gate structure comprises replacing the sacrificial layers of the second portions of the first and second sacrificial stack structures with portions of the gate structure.

10. The method of claim 1, wherein an uppermost end of the etch stop layer is not farther than the upper surfaces of the first and second active regions from the substrate.

11. The method of claim 1, wherein both the portion of the front contact plug and the portion of the back contact plug are in the etch stop layer.

12. The method of claim 1, wherein a width of the back contact plug increases with increasing distance from the front contact plug.

13. A method of forming an integrated circuit device, the method comprising:
  providing a substrate on which a front structure is provided, wherein the substrate comprises a front surface and a back surface opposite the front surface, and wherein the front structure comprises first and second active regions protruding from the front surface of the substrate, an isolation layer between the first and second active regions, an etch stop layer on the isolation layer, first and second channel layers respectively on the first and second active regions, first and second source/drain regions respectively on the first and second active regions and respectively contacting the first and second channel layers, and a gate structure crossing over the first and second channel layers and the isolation layer; and
  forming a front contact that contacts the first source/drain region;
  forming a back-side insulator after forming the front contact, wherein the isolation layer is between the etch stop layer and the back-side insulator; and
  forming a back contact plug that is in the isolation layer and the back-side insulator and contacts the front contact.

14. The method of claim 13, wherein forming the back contact plug comprises:
  etching the back-side insulator and the isolation layer, thereby forming a back-side opening in the back-side insulator and the isolation layer; and
  forming the back contact plug in the back-side opening.

15. The method of claim 13, wherein at least one of a portion of the front contact and a portion of the back contact plug is in the etch stop layer.

16. The method of claim 15, wherein the etch stop layer comprises a portion between the gate structure and the isolation layer.

* * * * *